United States Patent
Lin et al.

(10) Patent No.: US 12,069,862 B2
(45) Date of Patent: Aug. 20, 2024

(54) SEMICONDUCTOR DIES INCLUDING LOW AND HIGH WORKFUNCTION SEMICONDUCTOR DEVICES

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 106 days.

(21) Appl. No.: 17/585,932

(22) Filed: Jan. 27, 2022

(65) Prior Publication Data

US 2023/0022269 A1    Jan. 26, 2023

Related U.S. Application Data

(60) Provisional application No. 63/225,228, filed on Jul. 23, 2021.

(51) Int. Cl.
| | | |
|---|---|---|
| *H01L 29/40* | (2006.01) | |
| *H01L 21/28* | (2006.01) | |
| *H01L 29/423* | (2006.01) | |
| *H01L 29/66* | (2006.01) | |
| *H01L 29/78* | (2006.01) | |
| *H10B 51/10* | (2023.01) | |
| *H10B 51/20* | (2023.01) | |
| *H10B 51/30* | (2023.01) | |

(52) U.S. Cl.
CPC ........ *H10B 51/20* (2023.02); *H01L 29/40111* (2019.08); *H01L 29/42364* (2013.01); *H01L 29/42372* (2013.01); *H01L 29/6684* (2013.01); *H01L 29/78391* (2014.09); *H10B 51/10* (2023.02); *H10B 51/30* (2023.02)

(58) Field of Classification Search
CPC ........ H10B 51/20; H10B 51/10; H10B 51/30; H01L 29/40111; H01L 29/42364; H01L 29/42372; H01L 29/6684; H01L 29/78391; H01L 29/513; H01L 29/516
USPC .......................................................... 257/288
See application file for complete search history.

(56) References Cited

U.S. PATENT DOCUMENTS

| | | | |
|---|---|---|---|
| 6,764,884 B1 * | 7/2004 | Yu ..................... | H01L 29/66545 438/157 |
| 11,302,810 B1 * | 4/2022 | Gong ................. | H01L 29/4908 |

(Continued)

*Primary Examiner* — Sheikh Maruf
(74) *Attorney, Agent, or Firm* — FOLEY & LARDNER LLP

(57) ABSTRACT

A semiconductor die comprises a first set of semiconductor devices disposed at a first location of the semiconductor die and a second set of semiconductor devices disposed at a second location of the semiconductor die different from the first location. Each of the first set of semiconductor devices have a first workfunction to cause each of the first set of semiconductor devices to store memory for a first time period. Moreover, each of the second set of semiconductor devices have a second workfunction that is higher greater than the first workfunction to cause each of the second set of semiconductor devices to store memory for a second time period greater than the first time period.

20 Claims, 20 Drawing Sheets

(56) References Cited

U.S. PATENT DOCUMENTS

| | | | |
|---|---|---|---|
| 2009/0026540 A1* | 1/2009 | Sasaki | H01L 29/66803 257/344 |
| 2015/0364592 A1* | 12/2015 | van Dal | H10B 12/36 257/29 |
| 2017/0092756 A1* | 3/2017 | Lai | H01L 21/845 |
| 2017/0162250 A1* | 6/2017 | Slesazeck | G11C 11/2273 |
| 2017/0162587 A1* | 6/2017 | Chavan | H01L 29/516 |
| 2018/0083001 A1* | 3/2018 | Chen | H01L 21/28088 |
| 2018/0322912 A1* | 11/2018 | Duenkel | G11C 16/0466 |
| 2019/0035694 A1* | 1/2019 | More | H01L 21/823857 |
| 2019/0043991 A1* | 2/2019 | Tan | H01L 29/42324 |
| 2019/0103323 A1* | 4/2019 | Perng | H01L 29/4941 |
| 2020/0006359 A1* | 1/2020 | Wu | H01L 29/0657 |
| 2020/0006516 A1* | 1/2020 | Manipatruni | H01L 29/42364 |
| 2020/0176590 A1* | 6/2020 | Chuang | H01L 29/78696 |
| 2021/0028180 A1* | 1/2021 | Yamaguchi | H10B 51/00 |
| 2021/0082928 A1* | 3/2021 | Chen | H10B 53/30 |
| 2021/0375887 A1* | 12/2021 | Doornbos | H01L 29/40111 |
| 2021/0399135 A1* | 12/2021 | Polakowski | H10B 53/30 |
| 2022/0122995 A1* | 4/2022 | Ocker | H01L 29/516 |
| 2022/0173214 A1* | 6/2022 | Park | H01L 21/823807 |

\* cited by examiner

SEMICONDUCTOR DIES INCLUDING LOW AND HIGH WORKFUNCTION SEMICONDUCTOR DEVICES

CROSS-REFERENCE TO RELATED APPLICATIONS

This application claims the benefit of and priority to U.S. Patent App. No. 63/225,228, filed Jul. 23, 2021, the entire disclosure of which is incorporated herein by reference.

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
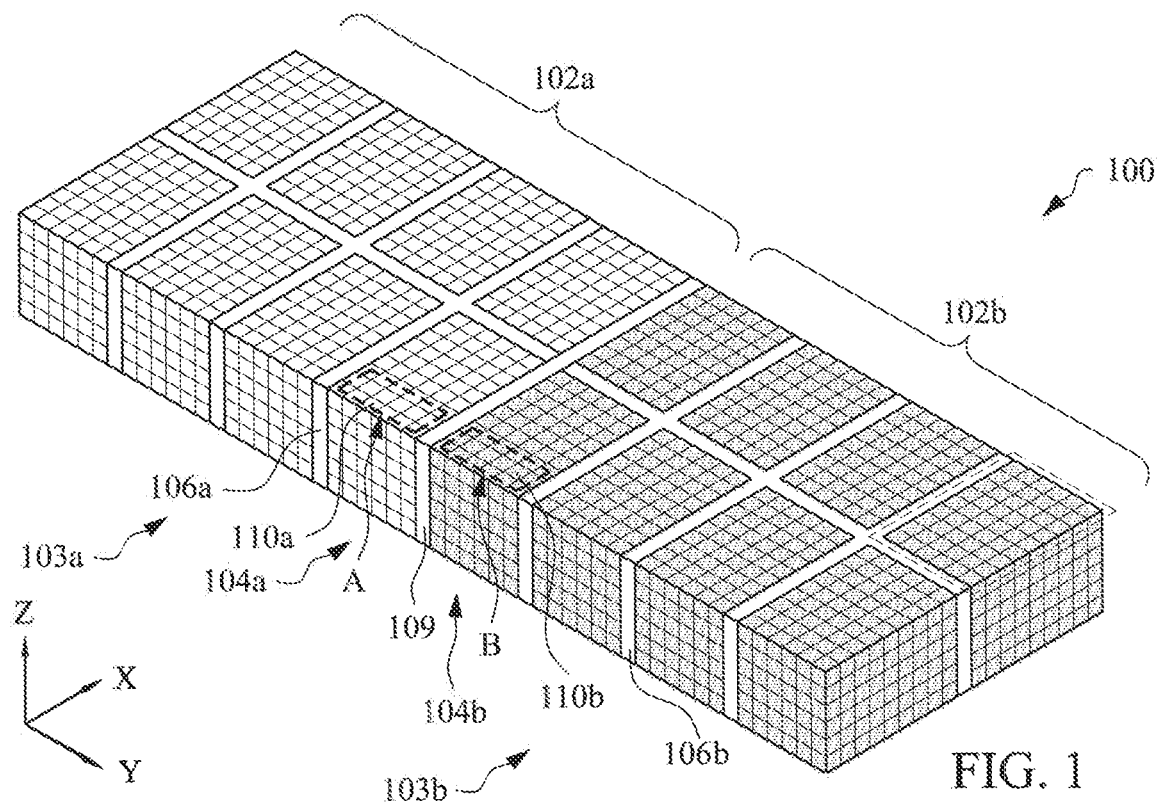
FIG. 1 is a perspective view of a semiconductor die having a first array of a first set of semiconductor devices having a first workfunction disposed on a first side of the semiconductor die, and a second array of a second set of semiconductor devices having a second workfunction greater than the first workfunction disposed on a second side of the semiconductor die, according to embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "about" and "approximately" generally mean plus or minus 10% of the stated value. For example, about 0.5 would include 0.45 and 0.55, about 10 would include 9 to 11, about 1000 would include 900 to 1100.

For next generation semiconductor devices, particularly memory devices, it is desirable to include memories that can perform high speed computing as well as memories that can provide long term storage (i.e., low leakage). Current semiconductor die manufacturing processes and semiconductor dies formed therefrom include high speed computing devices and the long term storage devices formed on separate dies, which are then integrated together using a chip integration process (e.g., using an interposer, or a 2.5 dimensional process). However, the separation between the two dies causes propagation delay as data is being transferred between computing and storage memory devices which can reduce data fidelity and increase processing time.

Embodiments of the present disclosure are discussed in the context of forming a semiconductor die, and particularly, in the context of forming semiconductor dies including 3D memory devices in which a first set of semiconductor devices that have low workfunction and provide high speed computing are formed monolithically with a second set of semiconductor devices that have high workfunction such that the second set of semiconductor devices provide long term storage. This beneficially reduces computing power needed to perform the same operation, reduces propagation losses, and reduces manufacturing cost, time, and complexity.

FIG. 1 is a perspective view of a semiconductor die 100, according to an embodiment. The semiconductor die 100 has a first array 103a of a first set 104a of semiconductor devices 110a (hereinafter "first semiconductor devices 110a") disposed at a first location of the semiconductor die 100, and a second array 103b of a second set 104b of second semiconductor devices 110b (hereinafter "second semiconductor devices 110b") disposed at a second location of the semiconductor die 100 different from the first location. For example, as shown in FIG. 1, the first array 103a is disposed on a first side 102a (or first portion) of the semiconductor die 100 in a first direction (e.g., the X-direction), and the second array 103b is disposed on a second side 102b of the semiconductor die 100 in the first direction (e.g., the X-direction). An array isolation layer 109 is interposed between the first array 103a and the second array 103b and serves to electrically isolate the first array 103a from the second array 103b and extends in a second direction (e.g., the Y-direction) that is perpendicular to the first direction. The array isolation layer 109 may be formed from an electrically insulative material, for example, silicon dioxide ($SiO_2$), silicon nitride (SiN), silicon oxide (SiO), silicon carbide nitride (SiCN), silicon oxycarbonitride (SiOCN), silicon oxynitride (SiON), $HfO_2$, TaOx, TiOx, AlOx, any other suitable material, or combination thereof.

The first semiconductor devices 110a included in each of the first set 104a of the first array 103a are disposed in a 3D configuration. For example, the first semiconductor devices 110a in the first set 104a are stacked on top of each other in the vertical direction (e.g., the Z-direction), and disposed adjacent to each other in the first direction (e.g., the X-direction) and the second direction (e.g., the Y-direction). In other words, the first set 104a of the first semiconductor devices 110a are arranged in a cube formation. A first set of isolation layers 106a is interposed between each of the first set 104a of the first set of semiconductor devices 110a to electrically isolate each of the first set 104a of first semi-conductor devices 110a from each other. For example, the first set of isolation layers 106a may include first portions that extend in the first direction (e.g., the X-direction) from a second portion that extends in the second direction (e.g., the Y-direction). The first set of isolation layers 106a may be formed from an electrically insulative material, for example, silicon dioxide ($SiO_2$), silicon nitride (SiN), silicon oxide (SiO), silicon carbide nitride (SiCN), silicon oxycarbonitride (SiOCN), silicon oxynitride (SiON), HfO2, TaOx, TiOx, AlOx, any other suitable material, or combination thereof.

Similarly, the second semiconductor devices 110b included in each of the second set 104b of the second array 103b are disposed in a 3D configuration, for example, stacked on top of each other in the vertical direction (e.g., the Z-direction), and disposed adjacent to each other in the first direction (e.g., the X-direction) and the second direction (e.g., the Y-direction), similar to the first set 104a of the first semiconductor devices 110a. A second set of isolation layers 106b is interposed between each of the second set 104b of the second set of semiconductor devices 110b to electrically isolate each of the second set 104b of second semiconductor devices 110b from each other. For example, the second set of isolation layers 106b may include first portions that extend in the first direction (e.g., the X-direction) from a second portion that extends in the second direction (e.g., the Y-direction). The second set of isolation layers 106b may be formed from the same material as the first set of isolation layers 106a.

Each of the first set 104a of the first semiconductor devices 110a have a first workfunction to cause each of the first semiconductor devices 110a to store memory for a time period in a range of about 0.1 microsecond to 999 microsecond. Moreover, each of the second set 104b of second semiconductor devices 110b have a second workfunction to cause the second semiconductor devices 110b to store memory for a time period of greater than 5 years. In some embodiments, a ratio of the first workfunction to the second workfunction may be in range of 1:2 to 1:100, inclusive. Other ranges and values are contemplated and should be considered to be within the scope of the present application.

Expanding further, the first semiconductor devices 110a have a low workfunction such that the first semiconductor devices 110a have a high cell current, high endurance or lifetime (e.g., greater than $1e^{10}$ days), can retain data in a time range of microseconds (e.g., in a range of 0.1 microsecond to 999 microsecond, inclusive), but is unable to perform 2-bit computation due to data loss concerns. These properties allow the first semiconductor devices 110a to be used for data processing and computing operations. In contrast, the second semiconductor devices 110b have a high workfunction such that the second semiconductor devices 110b have a low cell current relative to the cell current of the first semiconductor devices 110a, lower endurance than the first semiconductor devices 110a (e.g., a ratio of the endurance of the first semiconductor devices 110a to the second semiconductor devices 110b may be in a range of 2:1 to 10:1), can retain or store data for a time period of greater than 10 years, and can perform 2-bit operation allowing high density storage. Thus, the second semiconductor devices 110b can be used for long term data storage of data generated after processing and computing by the first semiconductor devices 110a. Thus, the semiconductor die 100 integrates processing and computing, as well as long term memory storage in a single die reducing processing time, increasing processing speed, and reducing lag and propagation delays, and data loss.

Figure 2:
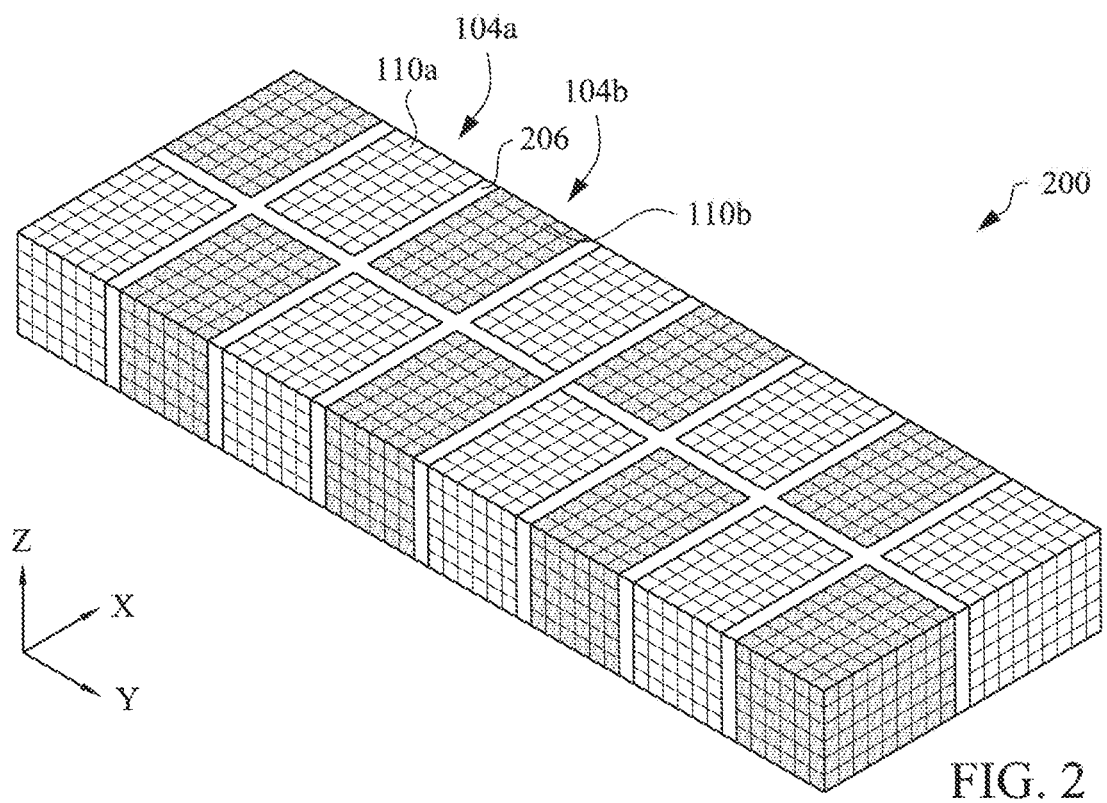
FIG. 2 is a perspective view of a semiconductor die having a first set of semiconductor devices having a first workfunction, and a second set of semiconductor devices having a second workfunction greater than the first workfunction, the first set of semiconductor devices being disposed adjacent to the second set of semiconductor devices in at least a first direction, a second direction perpendicular to the first direction, or the first direction and the second direction, according to embodiment.

FIG. 2 is a perspective view of a semiconductor die 200, according to another embodiment. The semiconductor die 200 includes the first set 104a of second semiconductor devices 110a and the second set 104b of first semiconductor devices 110b as described with respect to the semiconductor die 100. However, different from the semiconductor die 200, the first set 104a of first semiconductor devices 110a is disposed adjacent to the second set 104b of the second semiconductor devices 110b in at least the first direction (e.g., the X-direction), the second direction (e.g., the Y-direction), or the first direction and the second direction. In other words, a first set 104a is disposed alternately with a second set 104b in the X-direction as well as the Y-direction throughout a length and a width of the semiconductor die 200. A set isolation layer 206 interposed between each of the first set 104a and the second set 104b. For example, the set isolation layer 206 may include first portions that extend in the first direction (e.g., the X-direction) from a second portion that extends in the second direction (e.g., the Y-direction). The set isolation layer 206 may be formed from an electrically insulative material, for example, silicon dioxide (SiO₂), silicon nitride (SiN), silicon oxide (SiO), silicon carbide nitride (SiCN), silicon oxycarbonitride (SiOCN), silicon oxynitride (SiON), HfO2, TaOx, TiOx, AlOx, any other suitable material, or combination thereof.

It should be appreciated that while semiconductor die 100 and semiconductor die 200 illustrate particular embodiments of the first set 104a of first semiconductor devices 110a and the second set 104b of the second semiconductor dies 110b arranged in specific configurations, in other embodiments the first set 104a of the first semiconductor devices 110a and the second set 104b of the second semiconductor devices 110b can be arranged in any suitable configuration or arrangement in a semiconductor die with an isolation layer electrical isolating adjacent sets 104a/104b from each other. All such arrangements are contemplated and should be considered to be within the scope of the present disclosure.

Figure 3A:
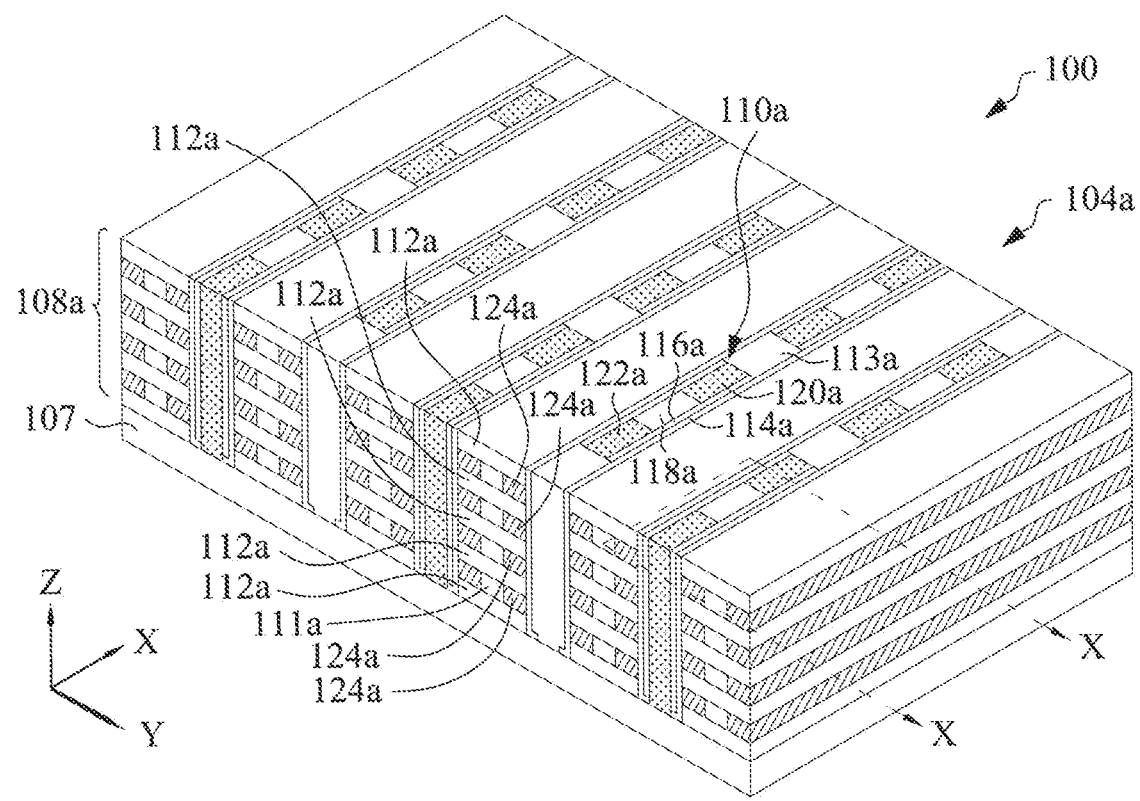
FIG. 3A is a top, perspective view of a portion of the semiconductor die of FIG. 1 including the first set of semiconductor devices indicated by the arrow A in FIG. 1, according to an embodiment.
Figure 4A:
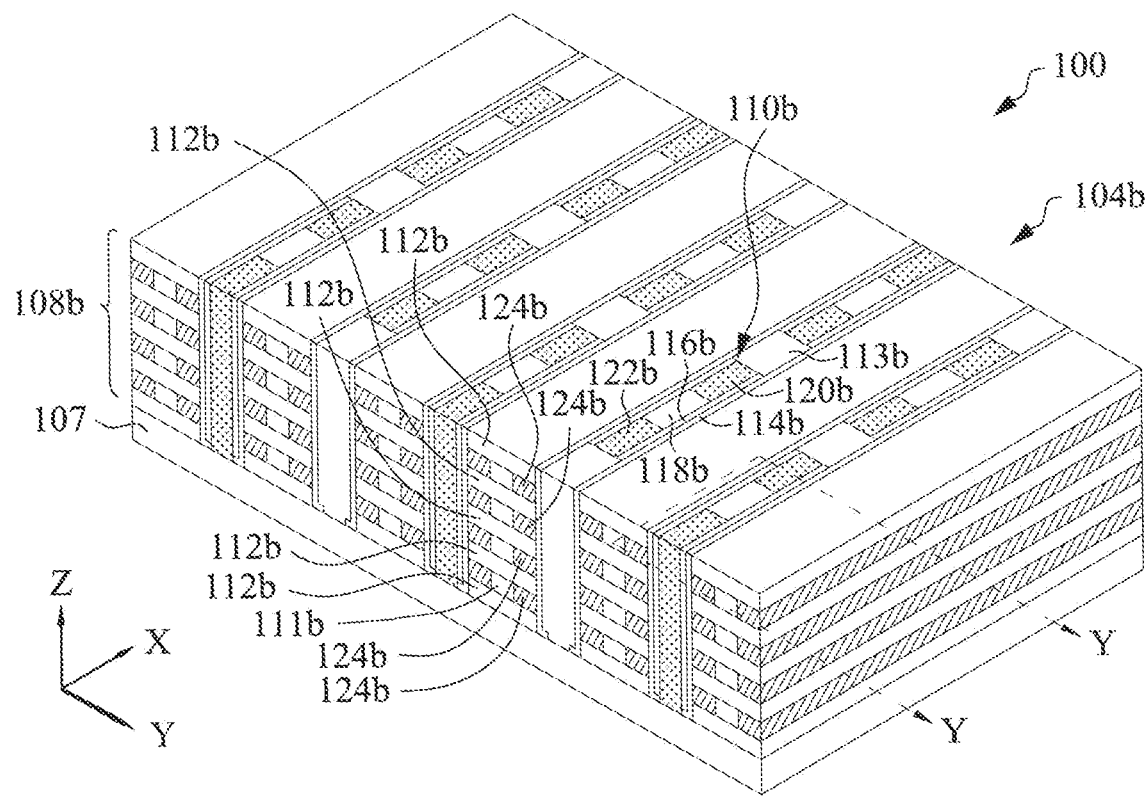
FIG. 4A is a top, perspective view of a portion of the semiconductor die of FIG. 1 including the second set of semiconductor devices indicated by the arrow B in FIG. 1, according to an embodiment.

FIG. 3A is a top, perspective view of a first portion of the semiconductor die 100 of FIG. 1 including the first set 104a of the first semiconductor devices 110a indicated by the arrow A in FIG. 1, and FIG. 4A is a top, perspective view of a second portion of the semiconductor die 100 indicated by the arrow B in FIG. 1 that includes the second set 104b of the second semiconductor devices 110b, according to an embodiment. The semiconductor die 100 includes a substrate 107 (e.g., a silicon, or silicon on insulator (SOI) substrate, germanium, silicon oxide, silicon carbide, silicon-germanium, silicon nitride, or any other suitable substrate) on which the plurality of semiconductor devices 110a/b are disposed. The first semiconductor devices 110a and the second semiconductor devices 110b are respectively arranged in a plurality of rows within their respective sets 104a/b, each of which extend in a first direction (e.g., the direction). Each semiconductor device 110a/b is separated and electrically isolated from an adjacent semiconductor device 110a/b within a row by a device spacer 113a/b, which may be formed from an electrically insulating material [e.g., silicon oxide (SiO₂), silicon nitride (SiN), silicon oxide (SiO), silicon carbide nitride (SiCN), silicon oxycarbonitride (SiOCN), silicon oxynitride (SiON), HfO2, TaOx, TiOx, AlOx, etc.].

Figure 3B:
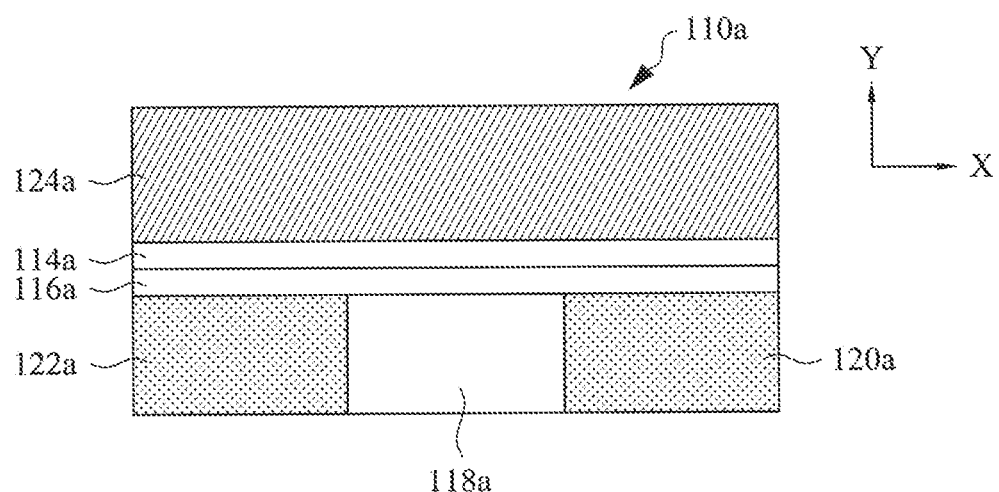
FIG. 3B is a top cross-section view of a first semiconductor device included in the first set of semiconductor devices of FIG. 3A, taken along the line X-X in FIG. 3A, according to an embodiment.
Figure 4B:
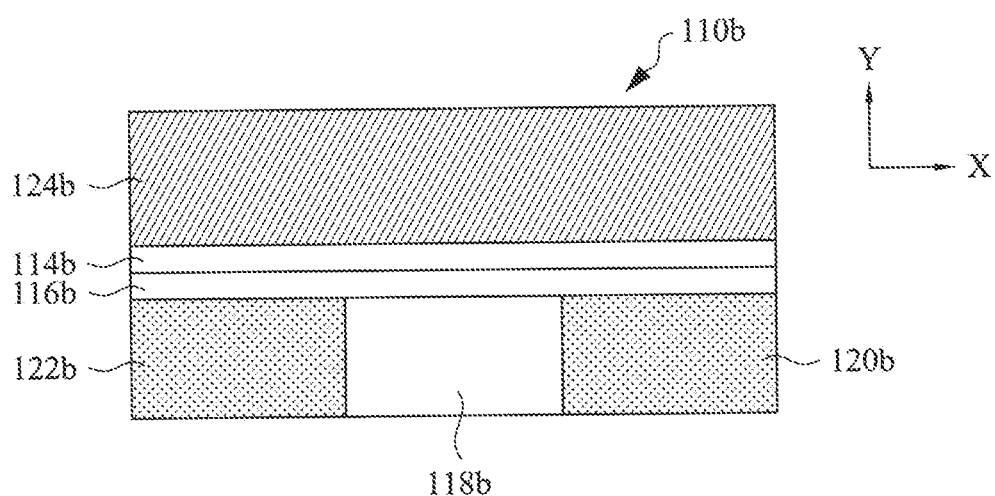
FIG. 4B is a top cross-section view of a second semiconductor device included in the second set of semiconductor devices of FIG. 4A, taken along the line Y-Y in FIG. 4A, according to an embodiment

FIG. 3B is a top cross-section view of the first semiconductor device 110a included in the first set 104a of FIG. 3A, taken along the line X-X in FIG. 3A, and FIG. 4B is a top cross-section view of the second semiconductor device 110b included in the second set 104b of FIG. 4A, taken along the line Y-Y in FIG. 4A. Referring now to FIGS. 3A-4B, each semiconductor device 110a/b includes a source 120a/b, and a drain 122a/b spaced apart from the source 120a/b in a first direction (e.g., the X-direction). An inner spacer 118a/b is disposed between the source 120a/b and the drain 122a/b. A channel layer 116a/b is disposed on radially outer surfaces of the source 120a/b and the drain 122a/b in a second direction (e.g., the Y-direction) orthogonal to the first direction, and extends in the first direction. A memory layer 114a/b is disposed on a radially outer surface of the channel layer 116a/b in the second direction and extends in the first direction. The semiconductor device 110a/b may also include a stack 108a/b disposed on outer surfaces of the memory layer 114a/b in the second direction, the stack 108a/b comprising a plurality of insulating layers 112a/b and a plurality of gate layers 124a/b alternatively stacked on top of each other in a vertical direction (e.g., the Z-direction), and extending in the first direction (e.g., the X-direction).

Expanding further, the source 120a/b and the drain 122a/b may include a conducting material, for example, metals such as Al, Ti, TiN, TaN, Co, Ag, Au, Cu, Ni, Cr, Hf, Ru, W, Pt, WN, Ru, any other suitable material or a combination or alloy thereof. In some embodiments, the source 120a/b and/or the drain 122a/b may include a semiconductor material, for example, an n or p-doped semiconductor such as Si, SiGe, or any other semiconductor material (e.g., IGZO, ITO, IWO, poly silicon, amorphous Si, etc.), and may be formed using a deposition process, an epitaxial growth process, or any other suitable process. The source 120a/b extends from a top surface of the semiconductor die 100 to the substrate 107 in a vertical direction (e.g., the Z-direction).

The inner spacer 118a/b extends between the source 120a/b and the drain 122a/b. The inner spacer 118a/b may be formed from an electrically insulating material, for example, silicon nitride (SiN), silicon oxide (SiO), SiO₂, silicon carbide nitride (SiCN), silicon oxycarbonitride (SiOCN), silicon oxynitride (SiON), HfO2, TaOx, TiOx, AlOx, etc. The inner spacer 118a/b extends from a top surface of the semiconductor die 100 to the substrate 107 in a vertical direction (e.g., the Z-direction).

A channel layer 116a/b is disposed outwards of a radially outer surface of the source 120a/b and the drain 122a/b in a second direction (e.g., the Y-direction) perpendicular to the first direction (e.g., the X-direction) and is in electrical contact with the source 120a/b and the drain 122a/b. The channel layer 116a/b extends from a top surface of the semiconductor die 100 to the substrate 107 in a vertical direction (e.g., the Z-direction). The channel layer 116a/b extends in the first direction (e.g., the X-direction) from an axially outward edge of the source 120a/b to an opposite axially outward edge of the drain 122a/b. In some embodiments, the channel layer 116a/b may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. In the particular embodiment shown in FIGS. 3A-4B, each semiconductor device 110a/b includes a pair of channel layers 116a/b. One of the pair of channel layers 116a/b is disposed radially outwards of first radially outer surfaces of the source 120a/b and the drain 122a/b in the second direction (e.g., the Y-direction), and the other of the pair of channel layers 116a/b is disposed radially outwards of second radially outer surfaces of the source 120a/b and the drain 122a/b opposite the first radially outer surfaces. In other embodiments, each semiconductor device 110a/b may include a single channel layer 116a/b disposed radially outwards of the first or the second radially outer surfaces of the source 120a/b and the drain 122a/b. In some embodiments, the channel layer 116a/b may include a doped material (e.g., a doped semiconductor), doped with a first concentration of a dopant (e.g., an n-type or p-type dopant).

A memory layer 114a/b is disposed on a radially outer surface of the channel layer 116a/b in the second direction (e.g., the Y-direction) and extends in the first direction (e.g., the X-direction). The memory layer 114a/b extends from a top surface of the semiconductor die 100a/b to the substrate 107 in a vertical direction (e.g., the Z-direction). In some embodiments, the memory layer 114a/b may include a ferroelectric material, for example, lead zirconate titanate (PZT), PbZr/TiO$_3$, BaTiO$_3$, PbTiO$_2$, HfO$_2$, Hr1-xZrxO$_2$, ZrO$_2$, TiO$_2$, NiO, TaO$_x$, Cu$_2$O, Nb$_2$O$_5$, AlO$_x$, etc. The memory layer 114a/b extends in the first direction (e.g., the X-direction) along the axial extent of the semiconductor die 100 in the first direction such that each semiconductor device 110a/b located in a row of the array of semiconductor devices 110a/b includes a portion of the memory layer 114a/b, and the memory layer 114a/b is connected to each of the semiconductor devices 110a/b included in a corresponding row. In other embodiments, each of the semiconductor devices 110a/b includes a memory layer which extends from an axially outer edge of the source 120a/b to an opposite axially outer edge of the drain 122a/b. As described with respect to the channel layer 116a/b, while FIGS. 3A and 4A show two memory layers 114a/b, a portion of each of which is included in each of the semiconductor devices 110a/b included in a row, in other embodiments, each semiconductor device 110a/b may include a single memory layer.

The semiconductor device 110a/b may include at least one gate layer disposed on a radially outer surface of the memory layer 114a/b in the second direction (e.g., the Y-direction), and extending in the first direction (e.g., the X-direction). For example, as shown in FIGS. 3A and 4A, the semiconductor die 100 also include a stack 108a/b disposed on the substrate 107. The stack 108a/b is disposed on an outer surface of the memory layer 114a/b, for example, on outer surfaces of each of the memory layer 114a/b included in each row of semiconductor devices 110a/b, such that the stack 108a/b is interposed between adjacent rows of semiconductor devices 110a/b. As shown in FIGS. 3A and 4A, the stack 108a/b include a plurality of insulating layers 112a/b, and a plurality of gate layers 124a/b alternatively stacked on top of one another in the vertical direction or the Z-direction. Particularly, the first semiconductor devices 110a includes a first gate layer 124a, and the second semiconductor devices 110b includes a second gate layer 124b different from the first gate layer 124a. For example, the at least one second gate layer 124b included in each of the second set of second semiconductor devices 110b may have a second property different from a first property of the at least one first gate layer 124a, the first property configured to cause each of the first set 104a of the first semiconductor devices 110a to have a first workfunction, and the second property configured to cause each of the second set 104b of the second semiconductor devices 110b to have a second workfunction greater than the first workfunction, as described in further detail herein.

In some embodiments, a topmost layer and a bottommost layer of the stack 108a/b may include an insulating layer 112a/b of the plurality of insulating layers 112a/b. The bottommost insulating layer 112a/b may be disposed over the substrate 107. The insulating layer 112a/b may include silicon nitride (SiN), silicon oxide (SiO), SiO$_2$, silicon carbide nitride (SiCN), silicon oxycarbonitride (SiOCN), silicon oxynitride (SiON), HfO2, TaOx, TiOx, AlOx, etc. Within the stack 108a/b, two parallel gate layers 124a/b are located adjacent to each other and interposed between two vertically separated insulating layers 112a/b in the vertical direction (e.g., the Z-direction), each of the two gate layers 124a/b associated with a different semiconductor device 110a/b. A sacrificial layer 111a/b is interposed between the two gate layers 124a/b in the second direction (e.g., the Y-direction) and serves to electrically isolate the two gate layers 124a/b from each other. In some embodiments, an adhesive layer may be interposed between the gate layer/s 124a/b and the adjacent insulating layers 112a/b as well as the sacrificial layer 111a/b disposed therebetween, and facilitate adhesion of the gate layer 124a/b to the insulating layer 112a/b, and may also serve as a spacer between two parallel gate layers 124a/b that are interposed between the same vertically separated insulating layers 112a/b. In some embodiments, the adhesion layer (e.g., the adhesive layer) may include e.g., titanium (Ti), chromium (Cr), TiN, TaN, WN, or any other suitable adhesive material.

As described previously, the first semiconductor devices 110a have a first workfunction and the second semiconductor devices 110b have a second workfunction which is greater than the first workfunction. In the embodiment shown in FIGS. 3A-4B, the source 120a, drain 122a, inner spacers 118a, channel layers 116a, and memory layers 114a included in the first semiconductor devices 110a, are substantially the same as the source 120b, drain 122b, inner spacer 118b, channel layers 116b, and memory layers 114b included in the second semiconductor devices 110b, i.e., are formed from the same material and are structurally and functionally similar to each other. However, the first gate layers 124a included in each of the first set 104a of first semiconductor devices 110a (FIGS. 3A-3B) include a first material to cause the each of the first set 104a of first semiconductor devices 110a to have the first workfunction (e.g., the first material has the first workfunction), and the second gate layer 124b included in each of the second set 104b of second semiconductor devices 110b (FIG. 4A-4B) comprises a second material different from the first material to cause each of the second set 104b of second semiconductor devices 110b to have the second workfunction that is greater than the first workfunction (e.g., the second material has the second workfunction). A workfunction value is associated with the material composition of the workfunction layer, i.e., the gate layers 124a/b, and thus, the material of the workfunction layer is chosen to tune its workfunction value so that a target threshold voltage V$_t$ is achieved in the first semiconductor devices 110a and the second semiconductor devices 110b that is to be formed.

In particular embodiments, the first material of the first gate layer 124a may be a n-type or n-doped semiconductor material which causes the first semiconductor devices 110a to have the first workfunction. Example n-type workfunction metals that may include Ti, Ag, TaAl, TaAlC, TiAlN, TaC, TaCN, TaSiN, Mn, Zr, other suitable n-type workfunction materials, or combinations thereof. Moreover, the second material of the second gate layer 124b may include a p-type or p-doped semiconductor material which causes the second semiconductor devices 110b to have the second workfunction. Example p-type workfunction metals that may include TiN, TaN, Ru, Mo, Al, WN, ZrSi$_2$, MoSi$_2$, TaSi$_2$, NiSi$_2$, WN, other suitable p-type workfunction materials, or combinations thereof. While shown as including a single layer, each of the gate layers 124a/b may include multi-layers of the workfunction material, or combinations thereof.

While FIGS. 3A-4B show particular embodiments of the first semiconductor devices 110a having a first workfunction and second semiconductor devices 110b having a second workfunction greater than the first workfunction, various configurations of first semiconductor devices having a low workfunction and second semiconductor devices having a high workfunction can be employed in the first set 104a and the second set 104b of the semiconductor die 100, the semiconductor die 200, or any other semiconductor die described herein. Example embodiments of first semiconductor devices and second semiconductor devices that can be included in the semiconductor die 100 or the semiconductor die 200 are shown and described in FIGS. 5A-9B. It should be appreciated that while FIGS. 3A-4B, 5A-5B, 6A-6B, 7A-7B, 8A-8B, and 9A-9B illustrate particular combinations of first and second semiconductor devices having different workfunctions, the semiconductor die 100, 200, or any other semiconductor die described herein can include any combination of first and second semiconductor devices as described with respect to FIGS. 3A-9B.

Figure 5A:
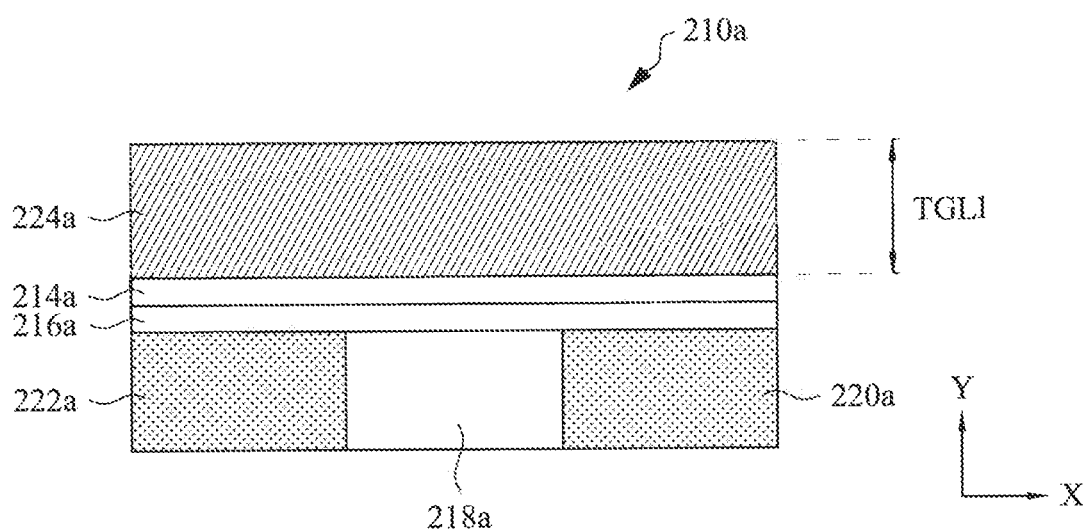
FIG. 5A is a top cross-section view of a first semiconductor device having a first workfunction.
Figure 5B:
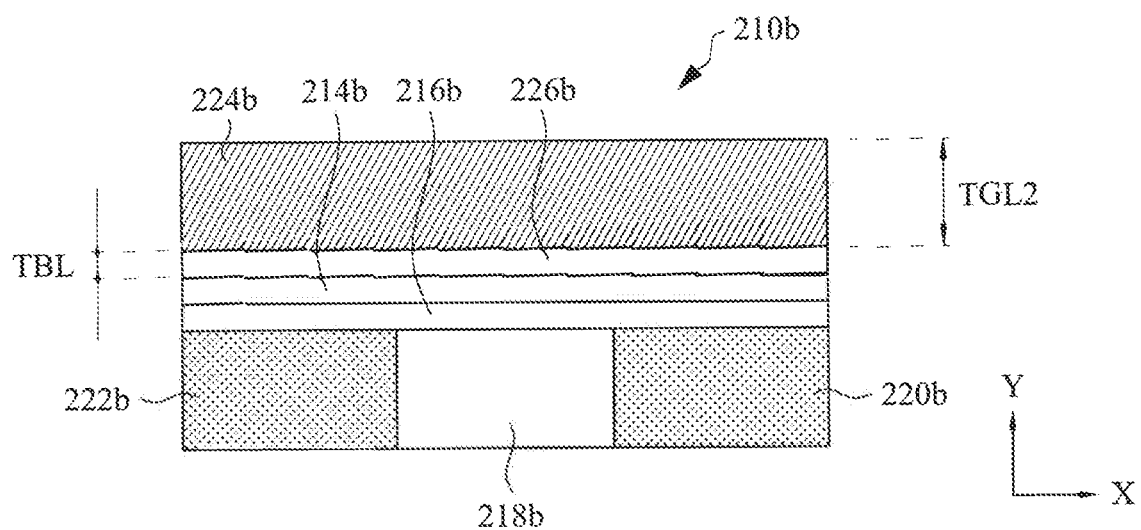
FIG. 5B is a top cross-section of a second semiconductor device having a second workfunction greater than the first workfunction, each of which can be included in the semiconductor die of FIG. 1 or FIG. 2, according to an embodiment.

In some embodiments, a barrier layer may be used to define a workfunction of a semiconductor device. For example, FIG. 5A is a top cross-section view of a first semiconductor device 210a having a first workfunction, and FIG. 5B is a top cross-section view of a second semiconductor device 210b having a second workfunction greater than the first workfunction, which can be included in the semiconductor die 100, 200, or any other semiconductor die described herein. The first semiconductor device 210a is substantially similar to the first semiconductor device 110a and includes a first source 220a spaced apart from a first drain 222a in a first direction (e.g., the X-direction) with a first inner spacer 218a disposed therebetween. A first channel layer 216a is disposed on outer surfaces of the first source 220a and the first drain 222a in the second direction (e.g., the Y-direction) and extends in the first direction. A first memory layer 214a is disposed on an outer surface of the first channel layer 216a, and at least one first gate layer 224a is disposed on an outer surface of the first channel layer 216a in the second direction and extends in the first direction. The first material of the first gate layer 224a includes a n-type or n-doped semiconductor material which causes the first semiconductor devices 210a to have the first workfunction, as described with respect to the first semiconductor device 210a. The first gate layer 224a has a first thickness TGL1 measured in the second direction (e.g., the Y-direction).

The second semiconductor device 210b includes a second source 220b spaced apart from a second drain 222b in the first direction (e.g., the X-direction) with a second inner spacer 218b disposed therebetween. A second channel layer 216b is disposed on outer surfaces of the second source 220b and the second drain 222b in the second direction (e.g., the Y-direction) and extends in the second direction. A second memory layer 214b is disposed on an outer surface of the second channel layer 216b. However, different from the second semiconductor device 110b, the second semiconductor device 210b includes a barrier layer 226b disposed on outer surface of the second memory layer 214b in the second direction and extending in the first direction. At least one second gate layer 224b is disposed on an outer surface of the barrier layer 226b in the second direction and extends in the first direction such that the barrier layer 226b is interposed between the second memory layer 214b and the at least one second gate layer 224b. A second material of the second gate layer 224b also includes an n-type or n-doped semiconductor material, which may be the same material used to form the first gate layer 224a. The barrier layer 226b is formed from any material that can be used to control the workfunction of the second semiconductor device 210b, for example, p-type workfunction material that may include TiN, TaN, Ru, Mo, Al, WN, $ZrSi_2$, $MoSi_2$, $TaSi_2$, $NiSi_2$, WN, other suitable high workfunction materials, or combinations thereof, or an n-type workfunction metals that may include Ti, Ag, TaAl, TaAlC, TiAlN, TaC, TaCN, TaSiN, Mn, Zr, other suitable n-type workfunction materials, or combinations thereof. In some embodiments, the barrier layer 226b includes a p-type or p-doped material.

The barrier layer 226b has a barrier layer thickness TBL. The material used to form the barrier layer 226b and the barrier layer thickness TBL can be adjusted to control workfunction of the second semiconductor device 210b, for example, by inhibiting metal diffusion form the second gate layer 224b which increases threshold voltage ($V_t$) and causes the second semiconductor device 210b to have the second workfunction that is greater than the first workfunction.

In some embodiments, the second gate layer 224b has a second thickness TGL2 measured in the second direction (e.g., the Y-direction) that is less than the first thickness TGL1. For example, a ratio between the first thickness TGL1 and the second thickness TGL2 (TGL1:TGL2) may be in a range of 1:0.9 to 1:0.1, inclusive (e.g., 1:0.9, 1:0.8, 1:0.7, 1:0.6, 1:0.5, 1:0.4, 1:0.3, 1:0.2, or 1:0.1, inclusive). Moreover, the first thickness TGL1 of the first gate layer 224a may be approximately equal to (e.g., within ±10%) a sum of a second thickness TGL2 of the second gate layer 224b included in each of the second set of semiconductor devices 210b and the thickness TBL of the barrier layer 226b included in the second semiconductor device 210b (i.e., TGL1=TGL2+TBL). These ranges are only examples and other ranges and values of first thickness TGL1, the second thickness, and the barrier layer TBL are contemplated and should be considered to be within the scope of this application.

Figure 6A:
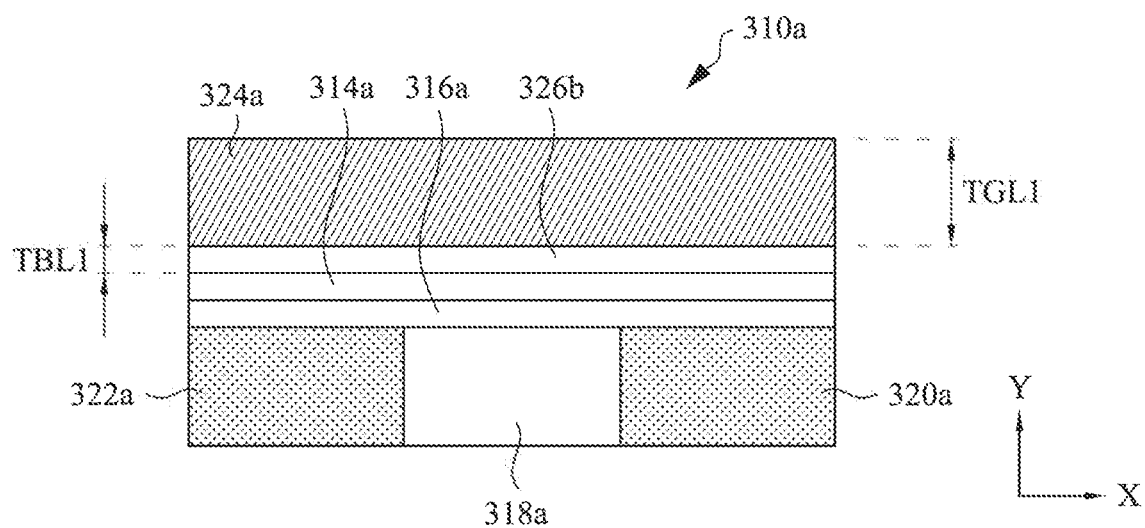
FIG. 6A is a top cross-section view of a first semiconductor device having a first workfunction.
Figure 6B:
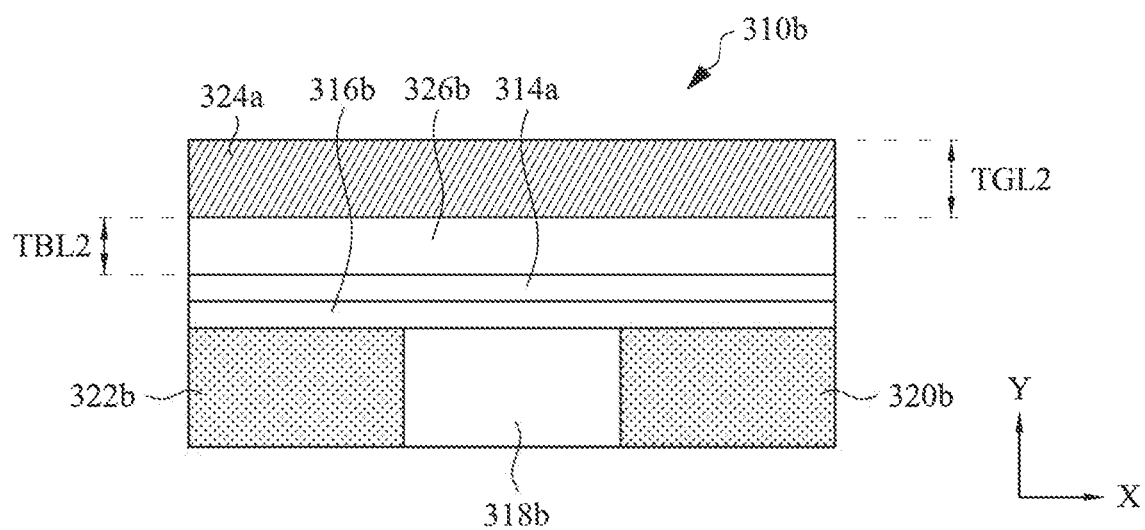
FIG. 6B is a top cross-section of a second semiconductor device having a second workfunction greater than the first workfunction, each of which can be included in the semiconductor die of FIG. 1 or FIG. 2, according to an embodiment.

In some embodiments, a thickness of a barrier layer may be adjusted to control a workfunction of semiconductor devices included in a semiconductor die. For example FIG. 6A is a top cross-section view of a first semiconductor device 310a having a first workfunction, and FIG. 6B is a top cross-section of a second semiconductor device 310b having a second workfunction greater than the first workfunction, which can be included in the semiconductor die 100, 200 or any other semiconductor die described herein, according to an embodiment.

The first semiconductor device 310a includes a first source 320a spaced apart from a first drain 322a in a first direction (e.g., the X-direction) with a first inner spacer 318a disposed therebetween. A first channel layer 316a is disposed on outer surfaces of the first source 320a and the first drain 322a in the second direction (e.g., the Y-direction) and extends in the first direction. A first memory layer 314a is disposed on an outer surface of the first channel layer 316a. However, different from the first semiconductor device 110a, 210a, the first semiconductor device 310a includes a first barrier layer 326a disposed on outer surface of the first memory layer 314a in the second direction and extending in the first direction. At least one first gate layer 324a is disposed on an outer surface of the first barrier layer 326a in the second direction and extends in the first direction such that the first barrier layer 326a is interposed between the first memory layer 314a and the at least one first gate layer 324a. A first material of the first gate layer 324a includes an n-type or n-doped semiconductor material. The first barrier layer 326a is formed from any material that can be used to control the workfunction of the first semiconductor device 310a, for example, p-type workfunction material that may include TiN, TaN, Ru, Mo, Al, WN, $ZrSi_2$, $MoSi_2$, $TaSi_2$, $NiSi_2$, WN, other suitable high workfunction materials, or combinations thereof, or an n-type workfunction metals that may include Ti, Ag, TaAl, TaAlC, TiAlN, TaC, TaCN, TaSiN, Mn, Zr, other suitable n-type workfunction materials, or combinations thereof. In some embodiments, the first barrier layer 326a includes a p-type or p-doped material. The first barrier layer 326a has a first barrier thickness TBL1 and the first gate layer 324a has a first thickness TGL1.

The second semiconductor device 310b includes a second source 320b spaced apart from a second drain 322b in the first direction (e.g., the X-direction) with a second inner spacer 318b disposed therebetween. A second channel layer 316b is disposed on outer surfaces of the second source 320b and the second drain 322b in the second direction (e.g., the Y-direction) and extends in the second direction. A second memory layer 314b is disposed on an outer surface of the second channel layer 316b. A second barrier layer 326b disposed on outer surface of the second memory layer 314b in the second direction and extending in the first direction. At least one second gate layer 324b is disposed on an outer surface of the second barrier layer 326b in the second direction and extends in the first direction such that the second barrier layer 326b is interposed between the second memory layer 314b and the at least one second gate layer 324b. A second material of the second gate layer 324b also includes a p-type or p-doped semiconductor material, which may be the same material used to form the first gate layer 324a. Moreover, the second barrier layer 326b may be formed from any material that can be used to control the workfunction of the second semiconductor device 310b, for example, a p-type or p-doped material, or an n-type or n-doped material, for example, the same material or different material from the first barrier layer 326a. In some embodiments, the second barrier layer 326b includes a p-type or p-doped material.

The second barrier layer 326b has a second barrier thickness TBL2 and the second gate layer 324b has a second thickness TGL2. The second barrier thickness TBL2 of the second barrier layer 326b is greater than the first barrier thickness TBL1 of the first barrier layer 326a. For example, a ratio between the first barrier thickness TBL1 and the second barrier thickness TBL2 may be in range of 0.1:1 to 0.9:1, inclusive (e.g., 0.1:1, 0.2:1, 0.3:1, 0.4:1, 0.5:1, 0.6:1, 0.7:1, 0.8:1, or 0.9:1, inclusive). The second barrier thickness TBL2 of the second barrier layer 326b creates a larger diffusion barrier between the second memory layer 314b and the second gate layer 324b of the second semiconductor device 310b, relative to the thinner first barrier layer 326a of the first semiconductor device 310a, thereby causing the second workfunction of the second semiconductor device 310b to be greater than the first workfunction of the first semiconductor device 310a.

The first thickness TGL1 of the first gate layer 324a is greater than the second thickness TGL2 of the second gate layer 324b. For example, a ratio between the first thickness TGL1 and the second thickness TGL2 may be in a range of 1:0.1 to 1:0.9, inclusive (e.g., 1:0.1, 1:0.2, 1:0.3, 1:0.4, 1:0.5, 1:0.6, 1:0.7, 1:0.8, or 1:0.9, inclusive). In some embodiments, a first sum of the first thickness TGL1 of the first gate layer 324a and the first barrier thickness TBL1 is approximately equal to a second sum of the second thickness TGL2 of the second gate layer 324b and the second barrier thickness TBL2. These ranges are only examples and other ranges and values of first thickness TGL1, the second thickness TGL2, and the barrier layer TBL1 and TBL2 are contemplated and should be considered to be within the scope of this application.

Figure 7A:
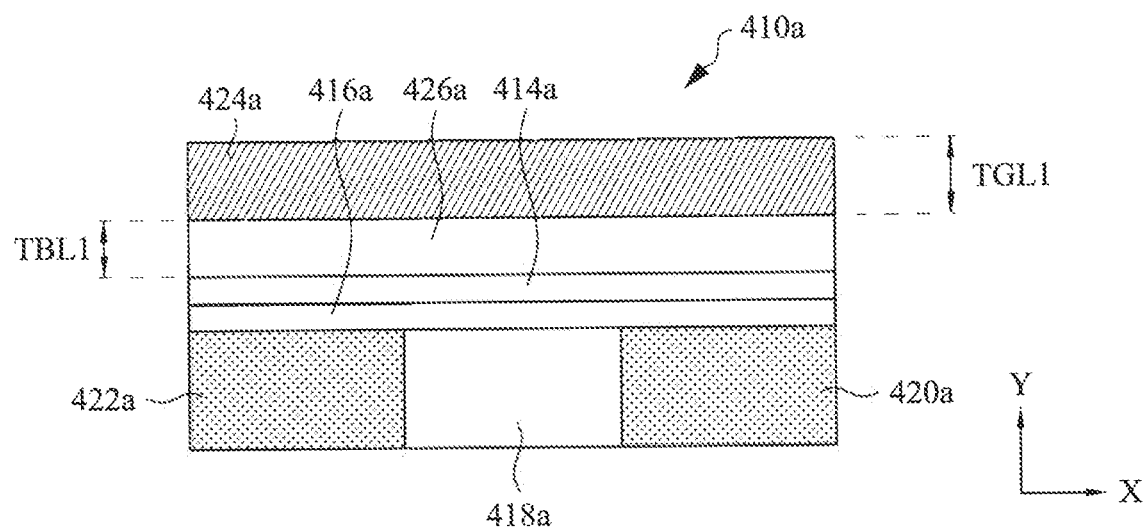
FIG. 7A is a top cross-section view of a first semiconductor device having a first workfunction.
Figure 7B:
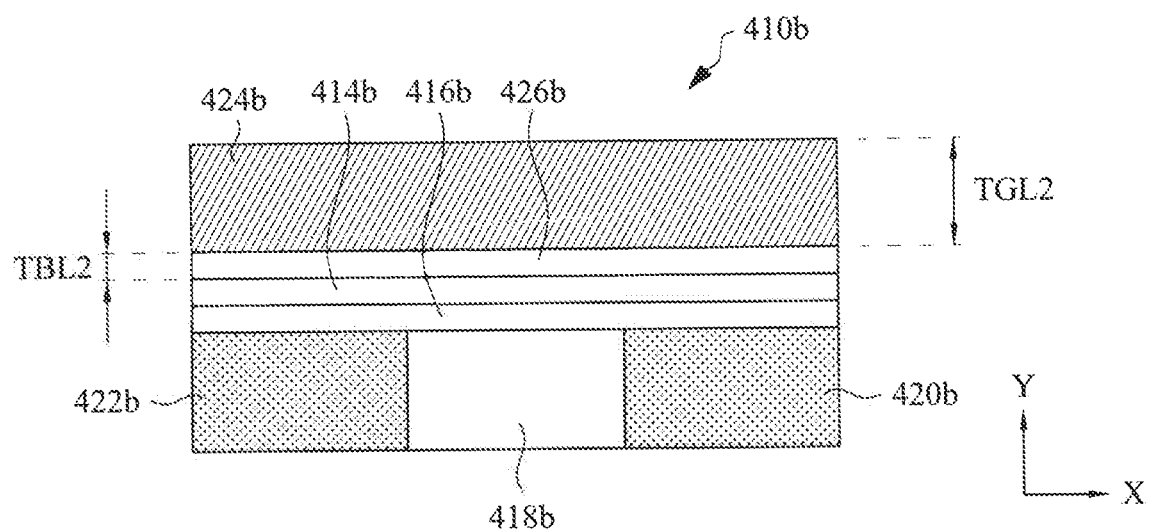
FIG. 7B is a top cross-section of a second semiconductor device having a second workfunction greater than the first workfunction, each of which can be included in the semiconductor die of FIG. 1 or FIG. 2, according to an embodiment.

FIG. 7A is a top cross-section view of a first semiconductor device 410a having a first workfunction, and FIG. 7B is a top cross-section of a second semiconductor device 410b having a second workfunction greater than the first workfunction, which can be included in the semiconductor die 100, 200 or any other semiconductor die described herein, according to another embodiment. The first and second semiconductor devices 410a, 410b depict another example embodiment of semiconductor devices in which a barrier layer thickness can be used t0 control the workfunction of semiconductor devices.

Expanding further, the first semiconductor device 410a includes a first source 420a spaced apart from a first drain 422a in a first direction (e.g., the X-direction) with a first inner spacer 418a disposed therebetween. A first channel layer 416a is disposed on outer surfaces of the first source 420a and the first drain 422a in the second direction (e.g., the Y-direction) and extends in the first direction. A first memory layer 414a is disposed on an outer surface of the first channel layer 416a. The first semiconductor device 410a includes a first barrier layer 426a disposed on outer surface of the first memory layer 414a in the second direction and extending in the first direction. At least one first gate layer 424a is disposed on an outer surface of the first barrier layer 426a in the second direction and extends in the first direction such that the first barrier layer 426a is interposed between the first memory layer 414a and the at least one first gate layer 424a.

Different from the first semiconductor device 110a, 210a, 310a, a first material of the first gate layer 424a includes a p-type or p-doped semiconductor material, for example, TiN, TaN, Ru, Mo, Al, WN, $ZrSi_2$, $MoSi_2$, $TaSi_2$, $NiSi_2$, WN, other suitable high workfunction materials, or combinations thereof. Moreover, the first barrier layer 426a is formed from any material that can be used to control the workfunction of the first semiconductor device 410a, for example, p-type workfunction material that may include TiN, TaN, Ru, Mo, Al, WN, $ZrSi_2$, $MoSi_2$, $TaSi_2$, $NiSi_2$, WN, other suitable high workfunction materials, or combinations thereof, or an n-type workfunction metals that may include Ti, Ag, TaAl, TaAlC, TiAlN, TaC, TaCN, TaSiN, Mn, Zr, other suitable n-type workfunction materials, or combinations thereof. In some embodiments, the first barrier layer 426a includes a n-type or n-doped material. The first barrier layer 426a has a first barrier thickness TBL1 and the first gate layer 424a has a first thickness TGL1.

The second semiconductor device 410b includes a second source 420b spaced apart from a second drain 422b in the first direction (e.g., the X-direction) with a second inner spacer 418b disposed therebetween. A second channel layer 416b is disposed on outer surfaces of the second source 420b and the second drain 422b in the second direction (e.g., the Y-direction) and extends in the second direction. A second memory layer 414b is disposed on an outer surface of the second channel layer 416b. A second barrier layer 426b disposed on outer surface of the second memory layer 414b in the second direction and extending in the first direction. At least one second gate layer 424b is disposed on an outer surface of the second barrier layer 426b in the second direction and extends in the first direction such that the second barrier layer 426b is interposed between the second memory layer 414b and the at least one second gate layer 424b. A second material of the first gate layer 424a also includes a p-type or p-doped semiconductor material, which may be the same material used to form the first gate layer 424a. Moreover, the second barrier layer 426b may be formed from any material that can be used to control the workfunction of the second semiconductor device 410b, for example, a p-type or p-doped material, or an n-type or n-doped material, for example, the same material or different material from the first barrier layer 426a. In some embodiments, the second barrier layer includes an n-type or n-doped material. The second barrier layer 426b has a second barrier thickness TBL2 and the second gate layer 424b has a second thickness TGL2.

Different from the semiconductor devices 310a/b, the second barrier thickness TBL2 of the second barrier layer 426b is less than the first barrier thickness TBL1 of the first barrier layer 426a. For example, a ratio between the first barrier thickness TBL1 and the second barrier thickness TBL2 may be in range of 1:0.1 to 1:0.9, inclusive (e.g., 1:0.1, 1:0.2, 1:0.3, 1:0.4, 1:0.5, 1:0.6, 1:0.7, 1:0.8, or 1:0.9, inclusive). The first barrier thickness TBL1 of the first barrier layer 426a creates a larger diffusion barrier relative to the second barrier thickness TBL2 of the second barrier layer 426b such that the first barrier layer 426a allows less diffusion and in combination with the p-type first gate layer 424a causes the first semiconductor device 410a to have a low first workfunction. In contrast, the thinner second barrier layer 426b of the second semiconductor device 410b allows more diffusion and in combination with the p-type second gate layer 424b causes the second semiconductor device 410b to have the high second workfunction.

The first thickness TGL1 of the first gate layer 424a is less than the second thickness TGL2 of the second gate layer 424b. For example, a ratio between the first thickness TGL1 and the second thickness TGL2 may be in a range of 0.1:1 to 0.9:1, inclusive (e.g., 0.1:1, 0.2:1, 0.3:1, 0.4:1, 0.5:1, 0.6:1, 0.7:1, 0.8:1, or 0.9:1, inclusive). In some embodiments, a first sum of the first thickness TGL1 of the first gate layer 424a and the first barrier layer 426a is approximately equal to a second sum of the second thickness TGL2 of the second gate layer 424b and the second barrier thickness TBL2. These ranges are only examples and other ranges and values of first thickness TGL1, the second thickness, and the barrier layer TBL are contemplated and should be considered to be within the scope of this application.

Figure 8A:
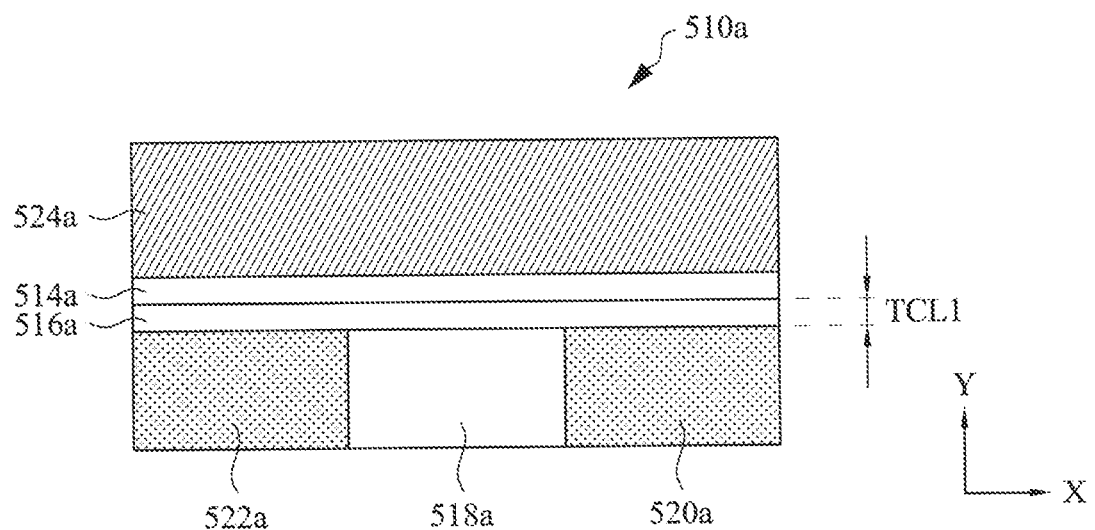
FIG. 8A is a top cross-section view of a first semiconductor device having a first workfunction.
Figure 8B:
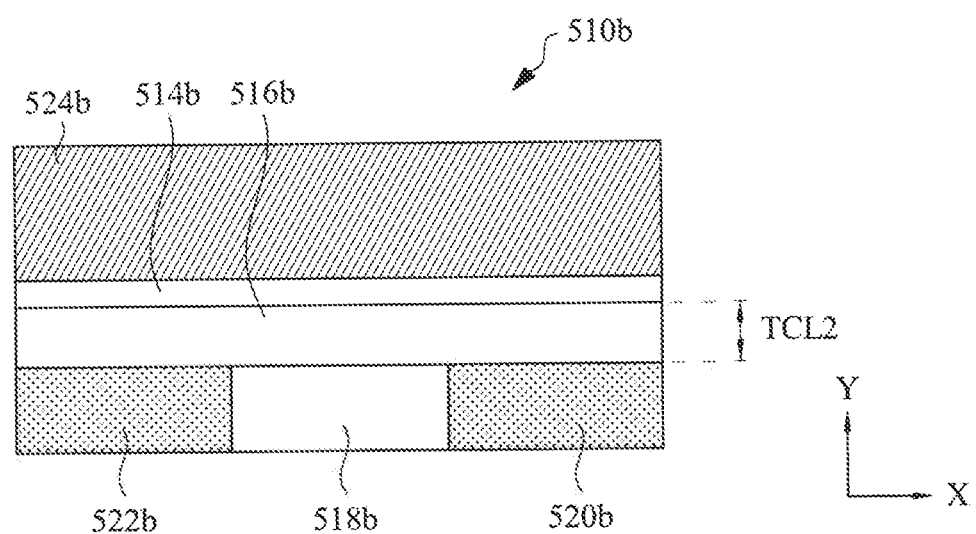
FIG. 8B is a top cross-section of a second semiconductor device having a second workfunction greater than the first workfunction, each of which can be included in the semiconductor die of FIG. 1 or FIG. 2, according to an embodiment.

In some embodiments, a thickness of the channel layer may be used to define a workfunction of the semiconductor devices included in the semiconductor die 100, 200, or any other semiconductor die described herein. For example, FIG. 8A is a top cross-section view of a first semiconductor device 510a having a first workfunction, and FIG. 8B is a top cross-section view of a second semiconductor device 510b having a second workfunction greater than the first workfunction, which can be included in the semiconductor die 100, 200, or any other semiconductor die described herein. The first semiconductor device 510a is substantially similar to the first semiconductor device 110a and includes a first source 520a spaced apart from a first drain 522a in a first direction (e.g., the X-direction) with a first inner spacer 518a disposed therebetween. A first channel layer 516a is disposed on outer surfaces of the first source 520a and the first drain 522a in the second direction (e.g., the Y-direction) and extends in the first direction. A first memory layer 514a is disposed on an outer surface of the first channel layer 516a, and at least one first gate layer 524a is disposed on an outer surface of the first channel layer 516a in the second direction and extends in the first direction. The first material of the first gate layer 524a may include an n-type or n-doped, or a p-type or p-doped semiconductor material. In some embodiments, the first gate layer 524a may include an n-type or n-doped material. Moreover, the first channel layer 516a may have a first channel thickness TCL1.

The second semiconductor device 510b includes a second source 520b spaced apart from a second drain 522b in the first direction (e.g., the X-direction) with a second inner spacer 518b disposed therebetween. A second channel layer 516b is disposed on outer surfaces of the second source 520b and the second drain 522b in the second direction (e.g., the Y-direction) and extends in the second direction. A second memory layer 514b is disposed on an outer surface of the second channel layer 516b. At least one second gate layer 524b is disposed on an outer surface of the second channel layer 516b in the second direction and extends in the first direction. A second material of the second gate layer 524b may include an n-type or n-doped semiconductor material, or a p-type or p-doped semiconductor material. In some embodiments, the second gate layer 524b includes a p-type or p-doped material. Different from the second semiconductor device 110b, 210b, 310b, 410b, the second channel layer 516b has a second channel thickness TCL2 which is different from the first channel thickness TCL1, for example, greater than the first channel thickness TCL1 of the first channel layer 516a such that the second semiconductor device 510b has the second workfunction that is greater than the first workfunction.

Adjusting the thickness of the second channel layer 516b relative to the first channel layer 516a is therefore, used to control depletion depth across the channel layer 516a/b and thus, the workfunction of the semiconductor devices 510a/b. In some embodiments, the first gate layer 524a includes an n-type material and the second gate layer 524b includes a p-type material. In such embodiments, the second channel thickness TCL2 may be greater than the first channel thickness TCL1. For example, a ratio of the second channel thickness TCL2 to the first channel thickness TCL1 (TCL2:TCL1) may be in a range of 1.5:1 to 5:1, inclusive (e.g., 1.5:1, 2:1, 2.5:1, 3:1, 3.5:1, 4:1, 4.5:1, or 5:1, inclusive). In other embodiments, the first gate layer 524a includes a p-type or p-doped material and the second gate layer 524b includes an n-type or n-doped material. In such embodiments, the first channel thickness TCL1 may be greater than the second channel thickness TCL2. For example, a ratio of the first channel thickness TCL1 to the second channel thickness TCL2 (TCL1:TCL2) may be in a range of 1.5:1 to 5:1, inclusive (e.g., 1.5:1, 2:1, 2.5:1, 3:1, 3.5:1, 4:1, 4.5:1, or 5:1, inclusive). These ranges are only examples and other ranges and values of first channel thickness TCL1 and the second channel thickness TCL2 are contemplated and should be considered to be within the scope of this application.

Figure 9A:
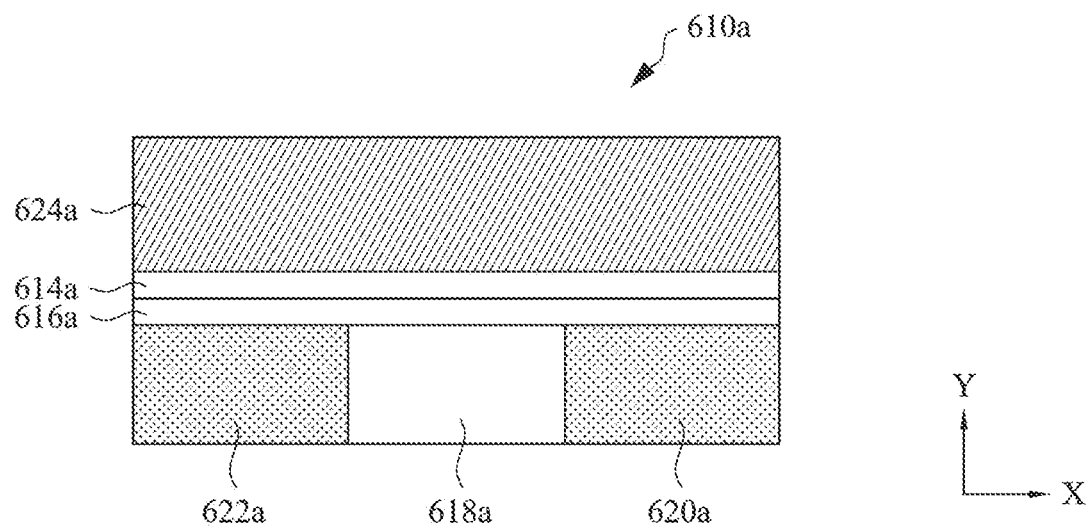
FIG. 9A is a top cross-section view of a first semiconductor device having a first workfunction.
Figure 9B:
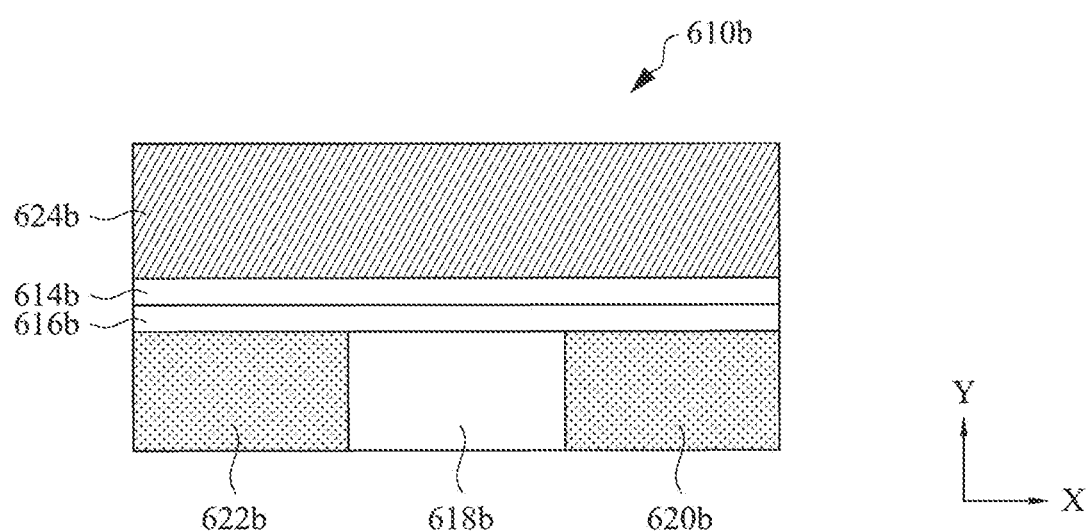
FIG. 9B is a top cross-section of a second semiconductor device having a second workfunction greater than the first workfunction, each of which can be included in the semiconductor die of FIG. 1 or FIG. 2, according to an embodiment.

In some embodiments, a material of a channel layer may be selected to cause the semiconductor device to either have a low workfunction or a high workfunction such that the semiconductor die includes both the low workfunction and high workfunction semiconductor devices. For example, FIG. 9A is a top cross-section view of a first semiconductor device 610a having a first workfunction, and FIG. 9B is a top cross-section view of a second semiconductor device 610b having a second workfunction greater than the first workfunction, which can be included in the semiconductor die 100, 200, or any other semiconductor die described herein. The first semiconductor device 610a is substantially similar to the first semiconductor device 110a and includes a first source 620a spaced apart from a first drain 622a in a first direction (e.g., the X-direction) with a first inner spacer 618a disposed therebetween. A first channel layer 616a is disposed on outer surfaces of the first source 620a and the first drain 622a in the second direction (e.g., the Y-direction) and extends in the first direction. A first memory layer 614a is disposed on an outer surface of the first channel layer 616a, and at least one first gate layer 624a is disposed on an outer surface of the first channel layer 616a in the second direction and extends in the first direction. The first material of the first gate layer 624a may include an n-type or n-doped, or a p-type or p-doped semiconductor material. In some embodiments, the first gate layer 624a may include an n-type or n-doped material.

The first channel layer 616a is formed from a first material, for example, Si (e.g., polysilicon or amorphous silicon); Ge; SiGe; a compound semiconductor including silicon carbide (SiC); gallium arsenic; gallium phosphide; indium phosphide; indium arsenide; indium antimonide; indium gallium zinc oxide (IGZO); indium tin oxide (ITO); indium zinc oxide (IZO); indium tungsten oxide (IWO); an alloy semiconductor including SiGe, GaAsP, AlInAs, AlGaAs, GaInAs, GaInP, and/or GaInAsP; any other suitable material, or combinations thereof.

The second semiconductor device 610b includes a second source 620b spaced apart from a second drain 622b in the first direction (e.g., the X-direction) with a second inner spacer 618b disposed therebetween. A second channel layer 616b is disposed on outer surfaces of the second source 620b and the second drain 622b in the second direction (e.g., the Y-direction) and extends in the second direction. A second memory layer 614b is disposed on an outer surface of the second channel layer 616b. At least one second gate layer 624b is disposed on an outer surface of the second channel layer 616b in the second direction and extends in the first direction. A second material of the second gate layer 624b may include an n-type or n-doped semiconductor material, or a p-type or p-doped semiconductor material. The second material of the second gate layer 624b may be the same or different from the first material of the first gate layer 624a.

The second channel layer 616b is formed from a second channel material that is different from the first channel material of the first channel layer 616a, for example, Si (e.g., polysilicon or amorphous silicon); Ge; SiGe; a compound semiconductor including silicon carbide (SiC); gallium arsenic; gallium phosphide; indium arsenide; indium antimonide; indium gallium zinc oxide (IGZO); indium tin oxide (ITO); indium zinc oxide (IZO); indium tungsten oxide (IWO); an alloy semiconductor including SiGe, GaAsP, AlInAs, AlGaAs, GaInAs, GaInP, and/or GaInAsP; any other suitable material, or combinations thereof.

For example, the first gate layer 624a and the second gate layer 624b may include a n-type material, and the first channel material may include a semiconductor material doped with a low concentration of a dopant which reduces threshold voltage and causes the first semiconductor device 610a to have the low first workfunction. Moreover, the second channel layer 616b also includes a semiconductor material (e.g., same or different from the first channel material) doped with a higher concentration of the dopant relative to the first semiconductor material which increases threshold voltage and causes the second semiconductor device 610b to have the high second workfunction. In other embodiments, the first channel material or the second channel material may be an oxide-based semiconductor. In such embodiments, the first channel layer 616a of the first semiconductor device 610a that has a low workfunction and high speed may have a lower amount of oxygen vacancies, relative to the second channel layer 616b of the second semiconductor device 610b that has a higher concentration of oxygen concentration. In this manner, by having a different channel material in the first semiconductor device 610a and the second semiconductor device 610b, the first semiconductor device 610a is configured to have a lower workfunction than the second semiconductor device 610b.

Figure 10A:
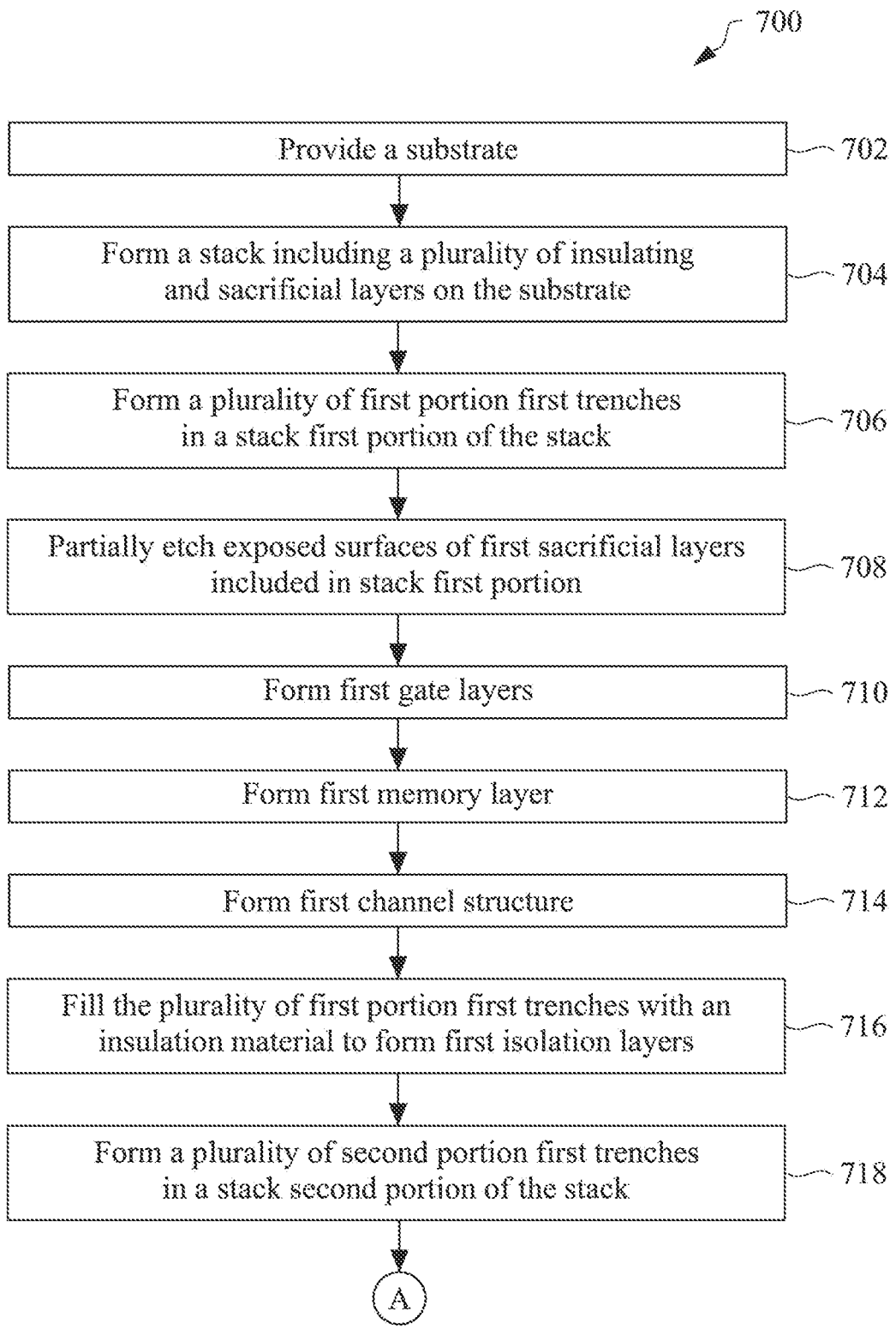
FIGS. 10A-10B are schematic flow charts of a method for forming a semiconductor die, according to an embodiment.
Figure 10B:
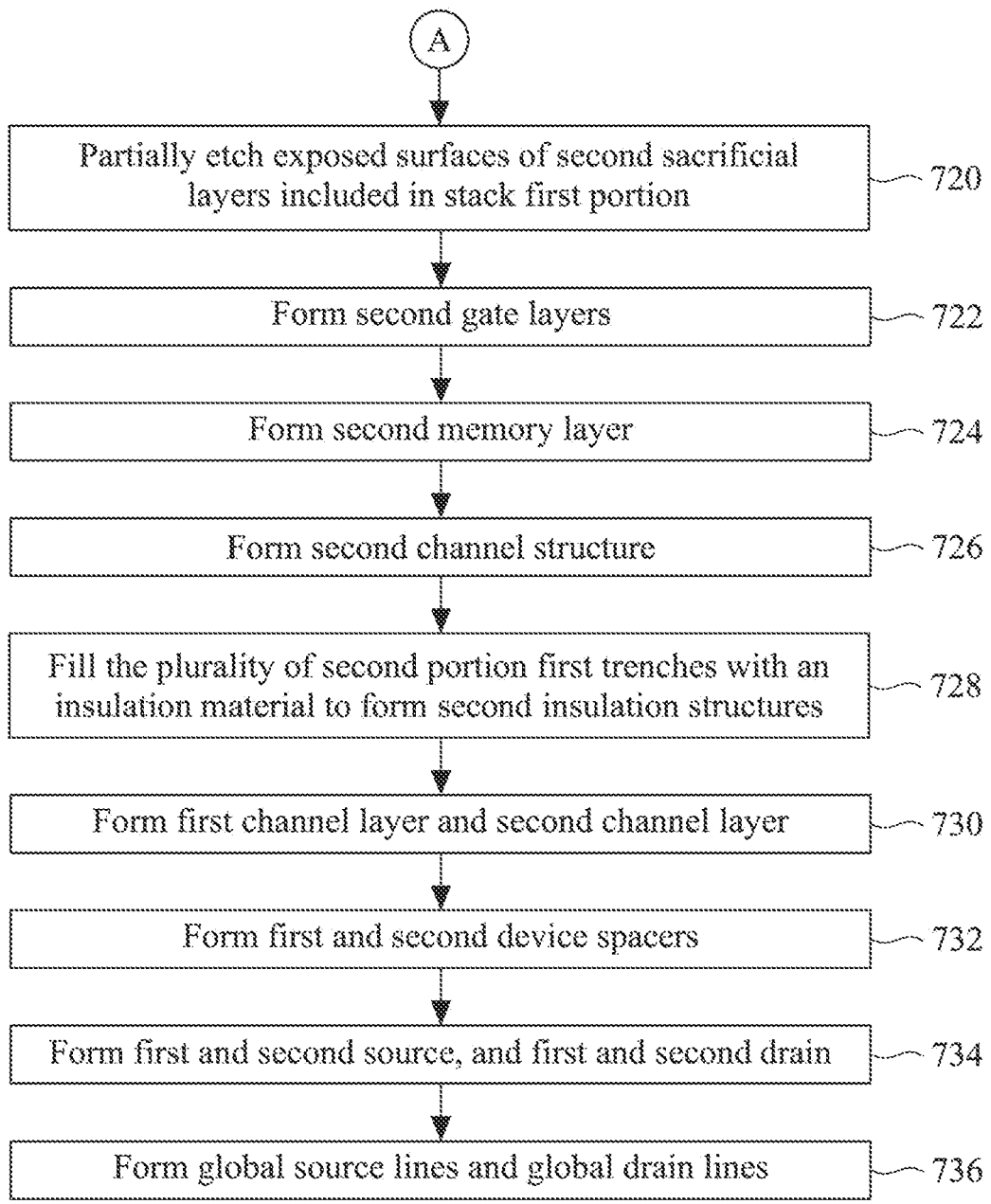

FIG. 10A-10B illustrate a flowchart of a method 700 for forming a semiconductor die 800, for example, a die including a plurality of 3D memory devices (e.g., any of the semiconductor devices described with respect to FIGS. 1-9B), according to an embodiment. For example, at least some of the operations (or steps) of the method 700 may be used to form a die including a set of first semiconductor devices having a first workfunction (e.g., the first semiconductor device 110a, 210a, 310a, 410a, 510a, 610a) and a set of second semiconductor devices having a second workfunction greater than the first workfunction (e.g., the second semiconductor device 110b, 210b, 310b, 410b, 510b, 610b), which may include nanosheet transistors, a nanowire transistor devices, vertical transistor devices, or the like. It should be noted that the method 700 is merely an example, and is not intended to limit the present disclosure. Accordingly, it is understood that additional operations may be provided before, during, and after the method 700 of FIGS. 10A-10C, and that some other operations may only be described briefly herein. In some embodiments, operations of the method 700 may be associated with perspective views and associate cross-section views of an example semiconductor die 800 at various fabrication stages as shown in FIGS. 11, 12, 13A, 13A, 14B, 15A, 15B, 16A, 16B, 17A, 17B, 18A, 18B, 19A, 19B, 20A, 20B, 21A, and 21B in some embodiments are represented with respect to the semiconductor die 800 that represents a 3D memory device, the operations are equally applicable to any other semiconductor device, for example, the semiconductor devices 110a/b, 210a/b, 310a/b, 410a/b, 510a/b, 610a/b shown in FIGS. 1-9B or any other semiconductor die (e.g., a GAA FET device, a nanosheet transistor device, a nanowire transistor device, a vertical transistor device, etc.). Although FIGS. 11-21B illustrate the semiconductor die 800 including the set of semiconductor devices 110a/110b, it is understood the semiconductor die 800 may include a number of other devices such as inductors, fuses, capacitors, coils, etc., which are not shown in FIGS. 11-21B, for purposes of clarity of illustration.

The method 700 may generally include providing a substrate. A stack including a plurality of insulating layers and a plurality of sacrificial layers alternatively stacked on top of each other is formed on the substrate. At least a portion of first sacrificial layers of the plurality of sacrificial layers located in a stack first portion of the stack is replaced to form first gate layers. The method 700 also includes forming first channel layers extending in a first direction in the stack first portion, and forming first memory layers extending in the first direction in the stack first portion. Subsequently, at least a portion of second sacrificial layers of the plurality of sacrificial layers located in a stack second portion of the stack are replaced to form second gate layers. The method 700 also includes forming second channel layers extending in the first direction in the stack second portion, and forming second memory layers extending in the first direction in the stack second portion. The method 700 also includes forming: first sources and first drains spaced apart from a corresponding first source in the first direction such that a corresponding first channel layer is disposed on radially outer surface of the first sources and the first drains in the first direction to form a first set of semiconductor devices, and second sources and second drains spaced apart from a corresponding second source in the first direction such that a corresponding second channel layer is disposed on radially outer surface of the second sources and the second drains in the first direction to form a second set of semiconductor devices. Each of the first set of semiconductor devices has a first workfunction different from a second workfunction of each of the second set of semiconductor devices. In some embodiments, the first gate layers included in each of the first set of semiconductor devices includes a first material to cause the each of the first set of semiconductor devices to have the first workfunction, and the second gate layer included in each of the second set of semiconductor devices includes a second material different from the first material to cause each of the second set of semiconductor devices to have the second workfunction.

Figure 11:
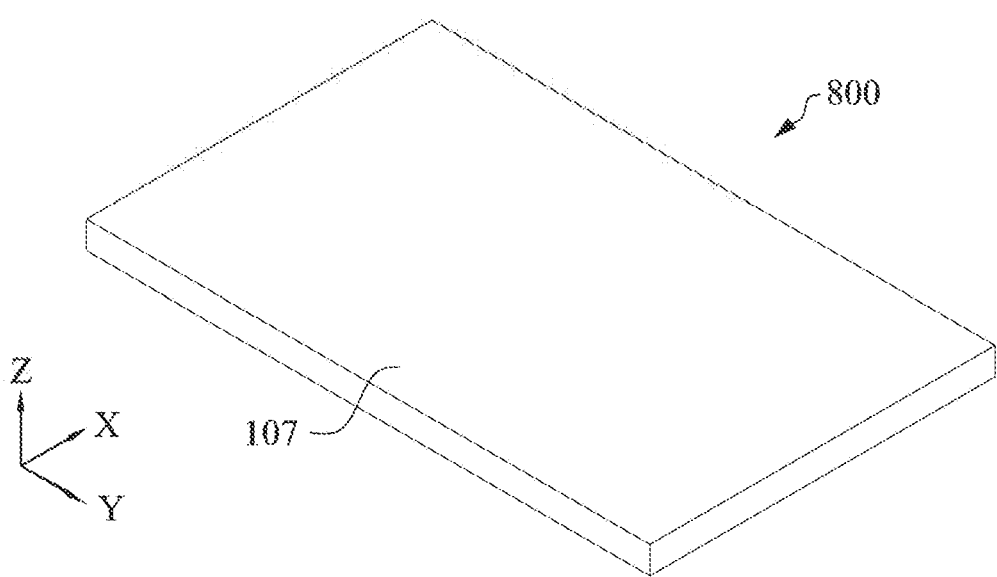
FIGS. 11, 12, 13A-13B, 14A-14B, 15A-15B, 16A-16B, 17A-17B, 18A-18B, 19A-19B, 20A-20B, and 21A-21B illustrate various views of an example semiconductor die (or a portion of the example semiconductor die) during various fabrication stages, made by the method of FIGS. 10A-10B, in accordance with some embodiments.

Expanding further, the method 700 starts with operation 702 that includes providing a substrate, for example, the substrate 107. Corresponding to operation 702, FIG. 11 shows a top, perspective view of the substrate 107. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, any other suitable insulator layer or combination thereof. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, any other suitable semiconductor material, or combinations thereof. In other embodiments, the substrate 107 may include an etch stop layer that may be formed using a plasma deposition process, for example, using PVD, CVD, LPCVD, PECVD, ALD, MBE, HARP, any other suitable process or a combination thereof. In various embodiments, the substrate 107 may include SiN, SiO, SiO$_2$, SiCN, SiOCN, SiON, HfO2, TaOx, TiOx, AlOx, a metal carbide, any other suitable material or combination thereof, and may include a single layer or various sublayers.

Figure 12:
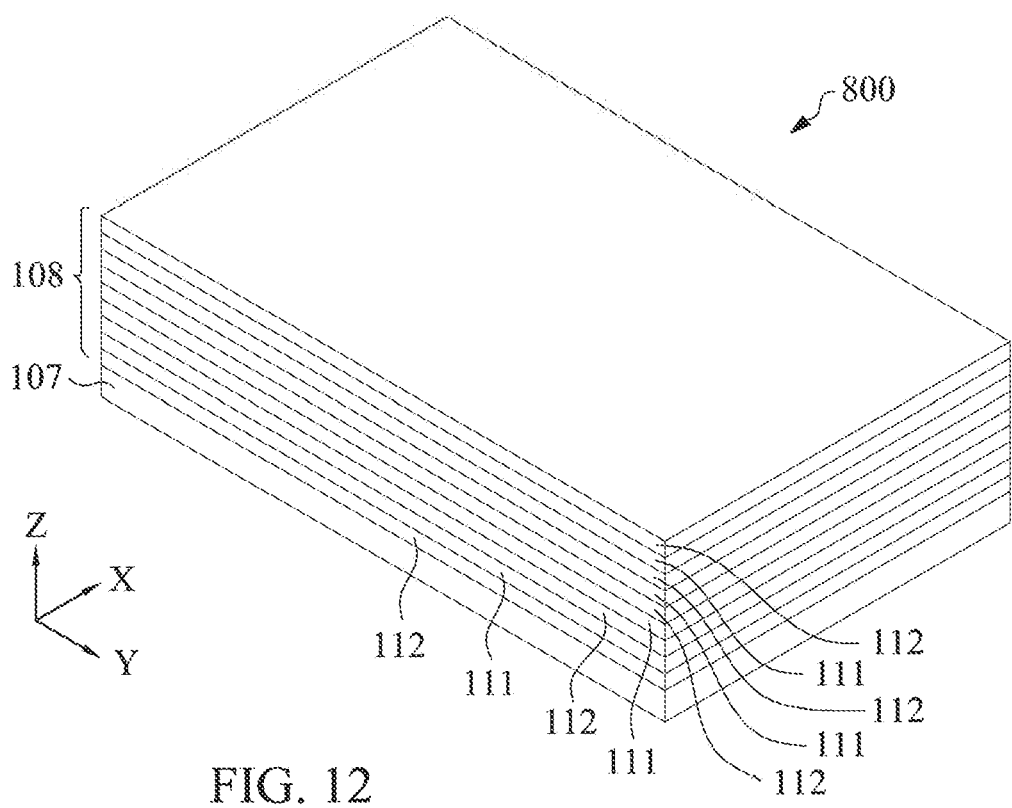

At operation 704, a stack (e.g., the stack 108 shown in FIGS. 3A, 4A, and 12) is formed on the substrate 107. The stack 108 includes a plurality of insulating layers (e.g., the insulating layers 112) and a plurality of sacrificial layers (e.g., the sacrificial layers 111 shown in FIGS. 3A, 4A, and 12) alternately stacked on top of each other in the vertical direction (e.g., the Z-direction). Corresponding to operation 704, FIG. 12 is a top, perspective view of the semiconductor die 800 after forming the stack 108 on top of the substrate 107. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIG. 12, a topmost layer (e.g., a layer distal most from the substrate 107) and a bottommost layer (e.g., a layer most proximate to the substrate 107) of the stack 108 may include an insulating layer 112. While FIG. 12 shows the stack 108 as including 5 insulating layers 112 and 4 sacrificial layers, the stack 108 may include any number of insulating layers 112 and sacrificial layers 111 (e.g., 4, 5, 6, 7, 8, 16, 24, 48, 64, 128, or even more). In various embodiments, if the number of sacrificial layers 111 in the stack 108 is n, a number of insulating layers 112 in the stack 108 may be n+1.

In some embodiments, each of the plurality of insulating layers 112 may have about the same thickness, for example, in a range of about 5 nm to about 100 nm, inclusive. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive, but other ranges and values are also contemplated and are within the scope of this disclosure). In other embodiments, a topmost sacrificial layer 111 and/or a bottom most sacrificial layer 111 may be thicker (e.g., 1.2×, 1.4×. 1.6×, 1.8×, 2×, 2.5×, or 3× thicker) than the other sacrificial layers 111 disposed therebetween.

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. In various embodiments, the insulating layers 112 may be formed from any suitable first material (e.g., an insulating material) as described with respect to the semiconductor die 100, and the sacrificial layers 111 may be formed from a second material (e.g., also an insulating material) that is different from the first material. In some embodiments, the sacrificial layers may 111 include SiN, HfO$_2$, TaO$_x$, TiO$_x$, AlO$_x$, or any other material that has a high etch selectivity relative to the insulating layers 112 (e.g., an etch selectivity ratio of at least 1:100). The sacrificial layers 111 are merely spacer layers that are eventually removed and do not form an active component of the semiconductor die 800.

In various embodiments, the insulating layers 112 and/or the sacrificial layers 111 may be epitaxially grown from the substrate 107. For example, each of the insulating layers 112 and the sacrificial layers 111 may be grown by a MBE process, a CVD process such as a metal organic CVD (MOCVD) process, a furnace CVD process, and/or other suitable epitaxial growth processes. In other embodiments, the insulating layers 112 and the sacrificial layers 111 may be grown using an atomic layer deposition (ALD) process.

Figure 13A:
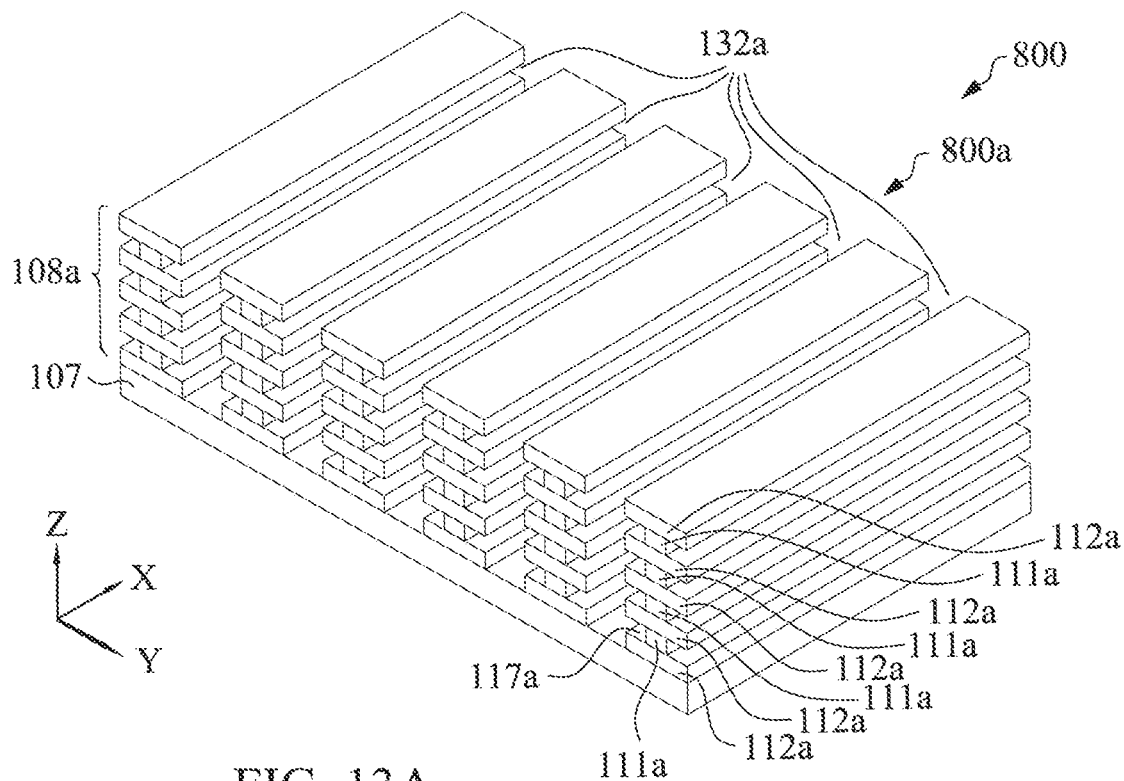
Figure 13B:
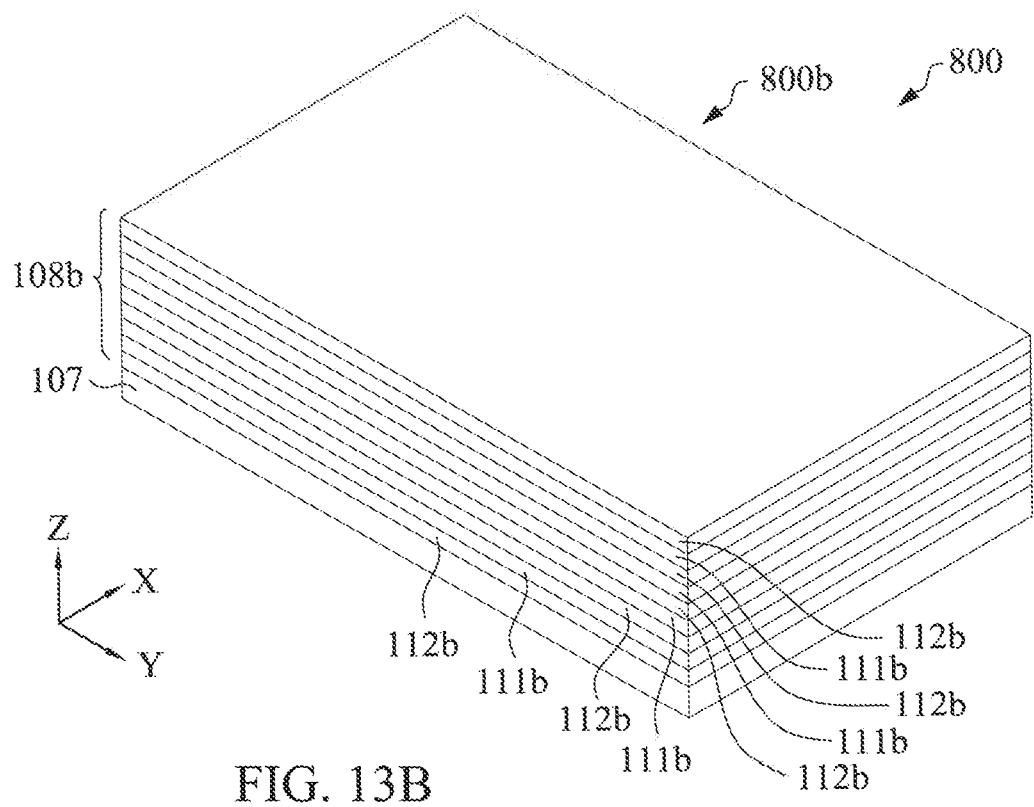

At operation 706, a plurality of first portion first trenches are formed in a stack first portion of the stack of the semiconductor die. At operation 708, an exposed surfaces of first sacrificial layers included in the stack first portion are partially etched. However, no operation is performed in a stack second portion of the stack of the semiconductor die during operations 706 and 708. Corresponding to operation 706-708, FIG. 13A is a top, perspective view of a first portion 800a of the semiconductor die 800 including a stack first portion 108a after forming a plurality of first portion first trenches 132a up to the substrate 107 and partially etching first sacrificial layers 111a, and FIG. 13B is top, perspective view of a second portion 800b of the semiconductor die 800 including a stack second portion 108b on which no processing operation is performed. The stack first portion 108a includes first insulating layers 112a and first sacrificial layers 111a. The plurality of first portion first trenches 132a extend in the X-direction and are formed through the stack first portion 108a up to the substrate 107 by etching the stack first portion 108a in the Z-direction. The etching process for forming the plurality of first portion first trenches 132a may include a plasma etching process, which can have a certain amount of anisotropic characteristic. For example, the first portion first trenches 132a may be formed, for example, by depositing a photoresist or other masking layer on a top surface of the first portion 800a of the semiconductor die 800, i.e., the top surface of the topmost first insulating layer 112a of the stack first portion 108a, and a pattern corresponding to the first portion first trenches 132a defined in the masking layer (e.g., via photolithography, e-beam lithography, or any other suitable lithographic process). In other embodiments, a hard mask may be used.

Subsequently, the stack first portion 108a may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first portion first trenches 132a. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIGS. 13A, the etch used to form the plurality of first portion first trenches 132a etches through each of the first sacrificial layers 111a and first insulating layers 112a of the stack first portion 108a such that each of the plurality of first portion first trenches 132a extend form the topmost first insulating layer 112a through the bottommost first insulating layer 112a to the substrate 107.

Next, exposed surfaces of the first sacrificial layers 111a within the first portion first trenches 132a are partially etched so as to reduce a width of the first sacrificial layers 111a relative to the first insulating layers 112a in the stack first portion 108a. For example, the exposed surfaces extend in the X-direction and etching the exposed surfaces of the first sacrificial layers 111a reduces a width of the first sacrificial layers 111a on either side of the first sacrificial layers 111a in the Y-direction. In some embodiments, the first sacrificial layers 111a may be etched using a wet etch process (e.g., hydrofluoric etch, buffered hydrofluoric acid, phosphoric acid, etc.). In other embodiments, the exposed surfaces of the sacrificial layers 111a may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the first sacrificial layers 111a in the Y-direction reduces a width of the first sacrificial layers 111a relative to the first insulating layers 112a disposed in the stack first portion 108a such that first cavities 117a are formed whose boundaries are formed by top and bottom surfaces of adjacent first insulating layers 112a and a surface of the partially etched first sacrificial layers 111a that face the first portion first trenches 132a and extend in the X-direction. In some embodiments, an adhesive layer may be formed on exposed portions of sidewalls of the first cavities 117a, and the sidewalls of the first insulating layer 112a that form a sidewall of the first portion first trenches 132a facilitate adhesion of gate layers to these surfaces. In various embodiments, the adhesive layers may include a material that has good adhesion with each of the first insulating layers 112a, the sacrificial layers 111a, and the gate layers 124a, for example, Ti, Cr, TiN, WN, etc. The adhesive layers may be deposited using any suitable method including, for example, molecular beam deposition (MBD), ALD, CVD, PECVD, MOCVD, epitaxial growth, and the like. In some embodiments, the adhesive layer may have a thickness in a range of 0.1 nm to 5 nm, inclusive, or any other suitable thickness. In other embodiments, the adhesion layer is excluded.

Figure 14A:
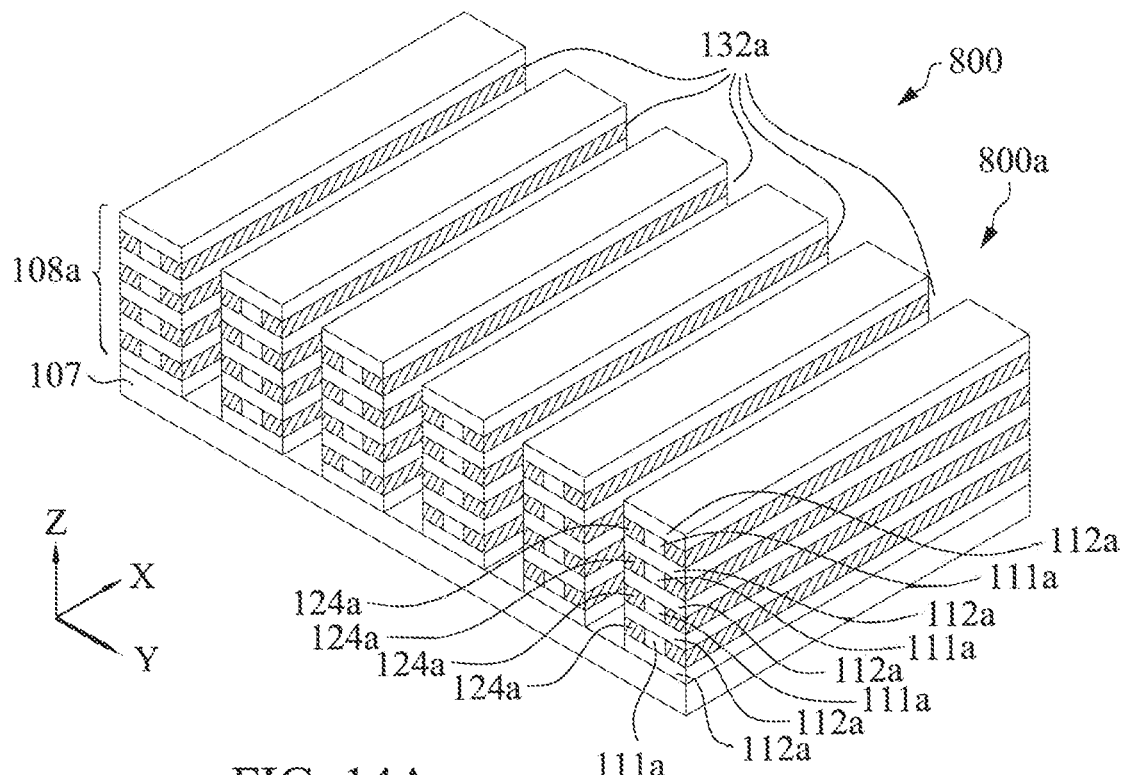
Figure 14B:
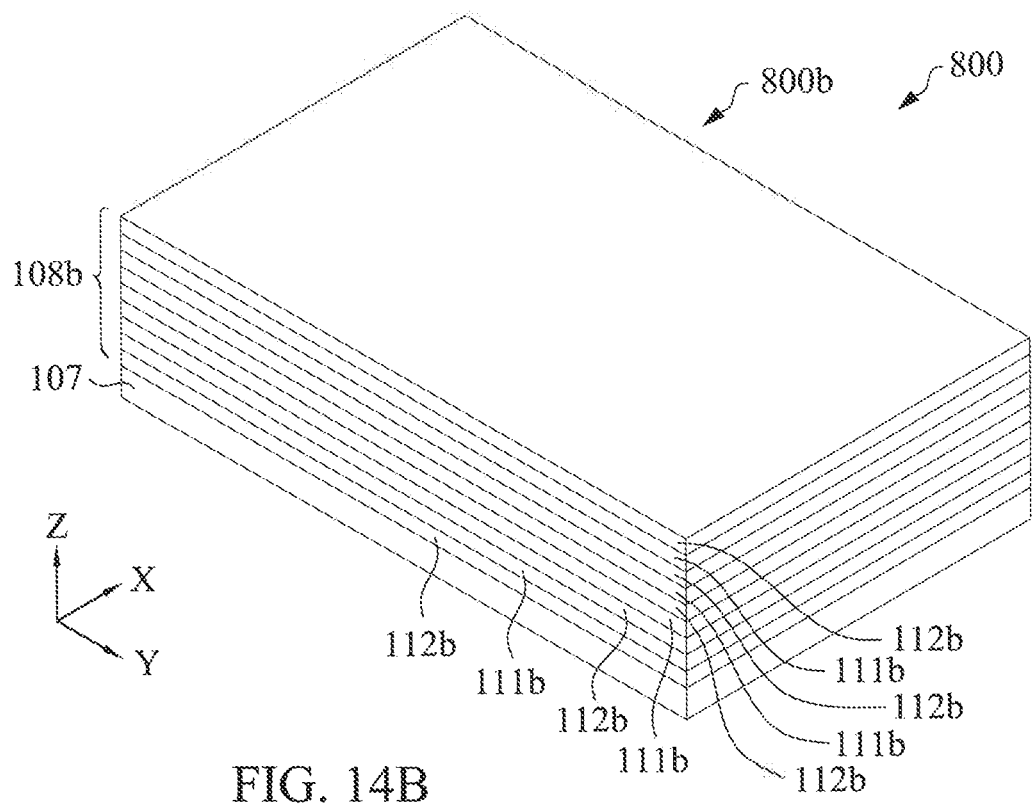

At operation 710, first gate layers are formed in first cavities of the stack first portion, but no processing operation is performed in the stack second portion. Corresponding to operation 710, FIG. 14A is a top, perspective view of the stack first portion after forming first gate layers 124a in the first cavities 117a, and FIG. 14B is a top, perspective view of the stack second portion 180b where no processing operation is performed. In various embodiments, the first gate layers 124a are formed by depositing a gate dielectric and/or gate metal in the first cavities 117a (e.g., over the adhesive layer), such that the portion of the first gate layers 124a is continuous along the walls of each of the first portion first trenches 132a. In various embodiments, the first gate layers 124a may be formed from a high-k dielectric material. Although, each of the portion of the first gate layers 124a shown in FIG. 14A is shown as a single layer, in other embodiments, the first gate layers 124a can be formed as a multi-layer stack (e.g., including a gate dielectric layer and a gate metal layer), while remaining within the scope of the present disclosure. The first gate layers 124a may be formed of different high-k dielectric materials or a similar high-k dielectric material. Example high-k dielectric materials include a metal oxide or a silicate of Hf, Al, Zr, La, Mg, Ba, Ti, Pb, and combinations thereof (e.g., Al, Ti, TiN, TaN, Co, Ag, Au, Cu, Ni, Cr, Hf, Ru, W, Pt, WN, Ru, etc.). The portion of the gate layers 124a can be deposited using any suitable method, including, for example, MBD, ALD, CVD, PECVD, MOCVD, epitaxial growth, and the like.

In some embodiments, the first gate layers 124a may be formed from a first material having a first workfunction which causes the first semiconductor devices 110a formed in the first portion 800a to have low first workfunction, as previously described herein. In some embodiments, the first gate layers 124a may include a stack of multiple metal materials. For example, the gate metal may be a p-type workfunction layer, an n-type workfunction layer, multi-layers thereof, or combinations thereof. The workfunction layer may also be referred to as a workfunction metal. Example p-type workfunction metals that may include TiN, TaN, Ru, Mo, Al, WN, $ZrSi_2$, $MoSi_2$, $TaSi_2$, $NiSi_2$, WN, other suitable p-type workfunction materials, or combinations thereof. Example n-type workfunction metals that may include Ti, Ag, TaAl, TaAlC, TiAlN, TaC, TaCN, TaSiN, Mn, Zr, other suitable n-type workfunction materials, or combinations thereof. A workfunction value is associated with the material composition of the workfunction layer, and thus, the material of the workfunction layer is chosen to tune its workfunction value so that a target threshold voltage $V_t$ is achieved in the device that is to be formed, i.e., a low threshold voltage in the first semiconductor devices 110a. The workfunction layer(s) may be deposited by CVD, PVD, ALD, and/or other suitable process.

At operation 712, a first memory layer is formed in each of the plurality of first portion first trenches on exposed radial surfaces of the insulating layers and the portion of the gate layers located in the second trenches, such that the first memory layer extends in the first direction (e.g., the X-direction), and from the top surface of the semiconductor die to the substrate. At operation 714, a first channel layer structure is formed within each of the plurality of first portion first trenches on exposed radial surfaces of the first memory layer such that the channel layer structure also extends in the first direction. At operation 716, the plurality of first portion first trenches are filled with an insulating material to form first isolation layers. However, no processing operation is performed on the stack second portion during operations 712-716.

Figure 15A:
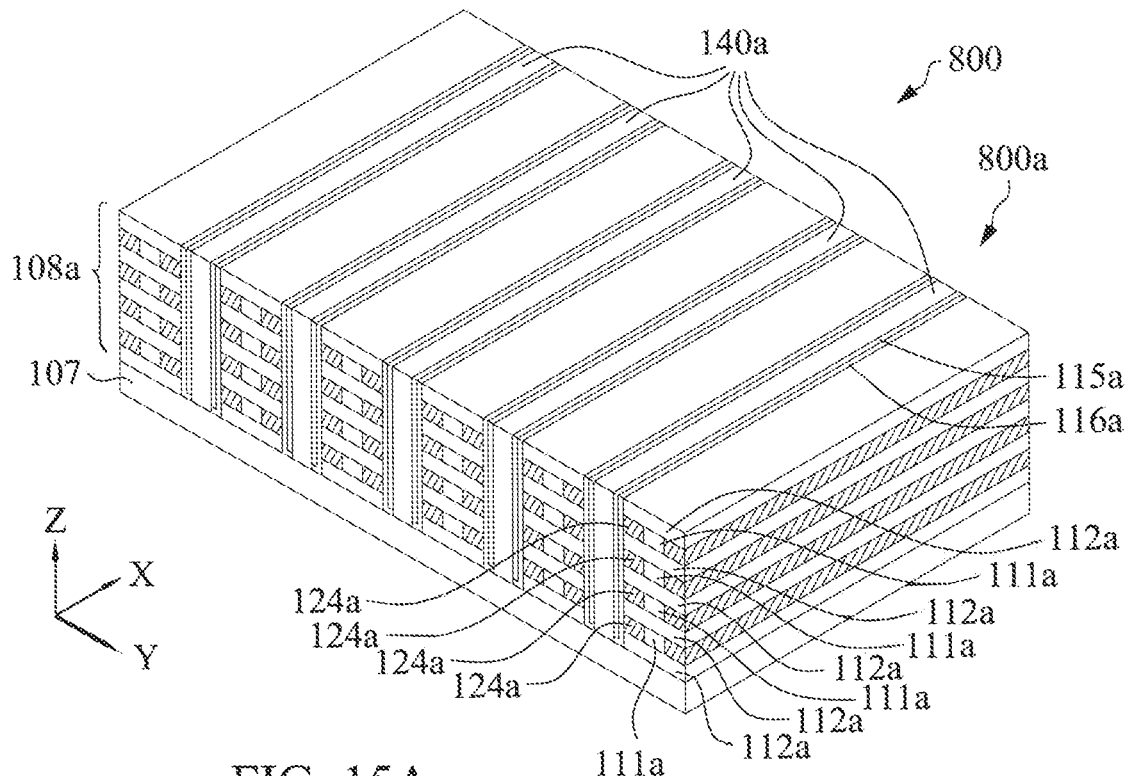
Figure 15B:
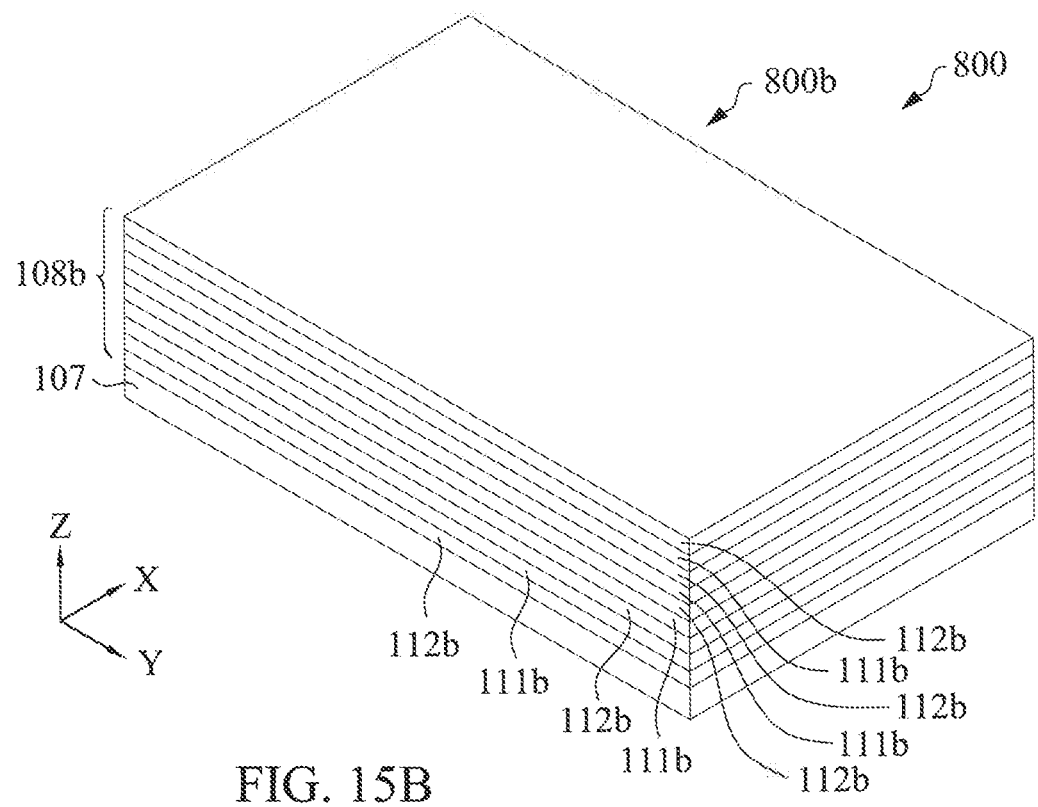

Corresponding to operations 712-716, FIG. 15A is a top, perspective view of the first portion 800a of the semiconductor die 800 after forming first channel layer structure 115a, first memory layer 114a, and first isolation layers 140a, and FIG. 15B is a top, perspective view of the second portion 800b on which no processing operation is performed. The first memory layer 114a may include a ferroelectric material, for example, lead zirconate titanate (PZT), PbZr/TiO$_3$, BaTiO$_3$, PbTiO$_2$, HfO$_2$, Hr1-xZ$_{rx}$O$_2$, ZrO$_2$, TiO$_2$, NiO, TaO$_x$, Cu$_2$O, Nb$_2$O$_5$, AlO$_x$, etc. The first memory layer 114a may be formed using PVD, CVD, LPCVD, PECVD, ALD, MBE, any other suitable process or a combination thereof. A conformal coating may be deposited such that the first memory layer 114a is continuous on the walls of the first portion first trenches 132a.

The first channel layer structure 115a is formed on a radially inner surface of the first memory layer 114a in the Y-direction. In some embodiments, the first channel layer structure 115a may be formed from a semiconductor material, for example, Si (e.g., polysilicon or amorphous silicon that may be n-type or p-type), Ge, SiGe, silicon carbide (SiC), IGZO, ITO, IZO, ZnO, IWO, etc. The first channel layer structure 115a may be formed using PVD, CVD, LPCVD, PECVD, ALD, MBE, any other suitable process or a combination thereof. A conformal coating may be deposited such that the first channel layer structure 115a is continuous on the radially inner surface of the first memory layer 114a. In some embodiments, the first channel layer structure 115a may be formed from a first channel material or have a first channel thickness to cause the first semiconductor devices 110a formed in the first portion 800a to have the first workfunction as previously described herein.

The insulating material may be deposited in the first portion first trenches 132a to form the first isolation layers 140a using any suitable method, for example, MBD, ALD, CVD, PECVD, MOCVD, epitaxial growth, and the like. The first isolation layer 140a may include SiO$_2$, SiON, SiN, SiCN, HfO$_2$, TaO$_x$, TiO$_x$, AlO$_x$, etc. In some embodiments, the first isolation layers 140a may be formed from the same material of the first insulating layers 112a. A CMP operation may be performed after filling the first portion first trenches 132a with the insulating material to form the first isolation layers 140a to planarize the top surface of the semiconductor die 800.

Figure 16A:
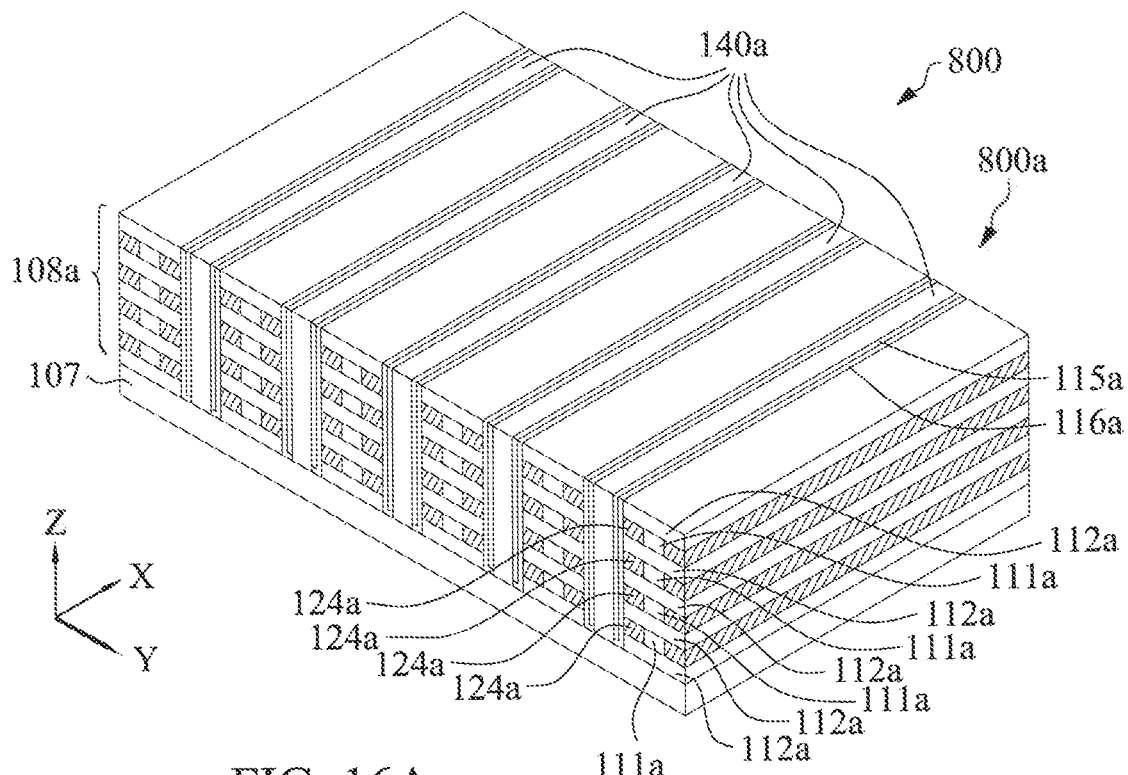
Figure 16B:
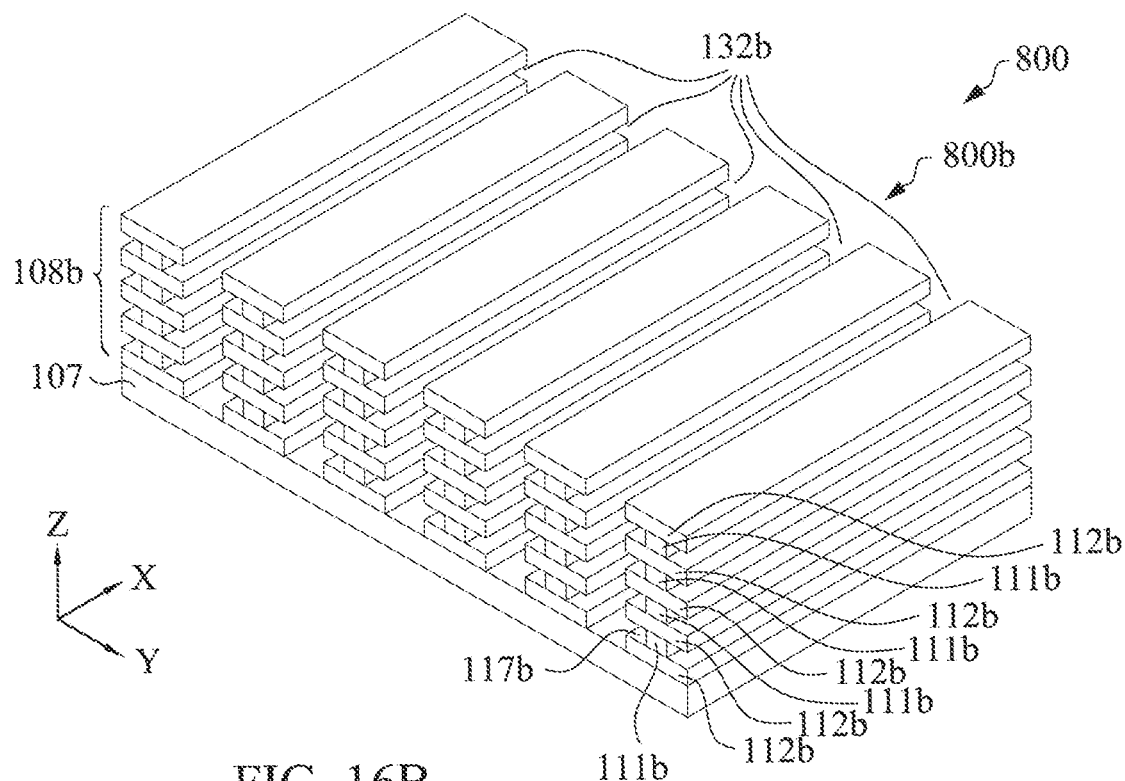

At operation 718, a plurality of second portion first trenches are formed in the stack second portion of the stack of the semiconductor die. At operation 720, exposed surfaces of second sacrificial layers included in the stack second portion are partially etched. However, no operation is performed in the stack first portion of the stack of the semiconductor die during operations 718 and 720. Corresponding to operation 718-720, FIG. 16B is a top, perspective view of a second portion 800b of the semiconductor die 800 including the stack second portion 108b after forming a plurality of second portion first trenches 132b up to the substrate 107 and partially etching exposed surfaces of second sacrificial layers 111b including the stack second portion 180b, and FIG. 16A is top, perspective view of the first portion 800a of the semiconductor die 800 on which no processing operation is performed during operations 718-720.

The stack second portion 108b includes second insulating layers 112b and second sacrificial layers 111b. The plurality of second portion first trenches 132b extend in the X-direction and are formed through the stack second portion 108b up to the substrate 107 by etching the stack second portion 108b in the Z-direction. The etching process for forming the plurality of second portion first trenches 132b may include a plasma etching process, which can have a certain amount of anisotropic characteristic. For example, the second portion first trenches 132b may be formed, for example, by depositing a photoresist or other masking layer on a top surface of the second portion 800b of the semiconductor die 800, i.e., the top surface of the topmost second insulating layer 112b of the stack second portion 108b, and a pattern corresponding to the second portion first trenches 132b defined in the masking layer (e.g., via photolithography, e-beam lithography, or any other suitable lithographic process). In other embodiments, a hard mask may be used.

Subsequently, the stack second portion 108b may be etched using a plasma etching process (including radical plasma etching, remote plasma etching, and other suitable plasma etching processes, RIE, DRIE), gas sources such as Cl$_2$, HBr, CF$_4$, CHF$_3$, CH$_2$F$_2$, CH$_3$F, C$_4$F$_6$, BCl$_3$, SF$_6$, H$_2$, NF$_3$, and other suitable etch gas sources and combinations thereof can be used with passivation gases such as N$_2$, O$_2$, CO$_2$, SO$_2$, CO, CH$_4$, SiCl$_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second portion first trenches 132b. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 16B, the etch used to form the plurality of second portion first trenches 132b etches through each of the second sacrificial layers 111b and the second insulating layers 112b of the stack second portion 108b such that each of the plurality of second portion first trenches 132b extend form the topmost second insulating layer 112b through the bottommost second insulating layer 112b to the substrate 107.

Next, exposed surfaces of the second sacrificial layers 111b within the second portion first trenches 132b are partially etched so as to reduce a width of the second sacrificial layers 111b relative to the second insulating layers 112b in the stack second portion 108b. For example, the exposed surfaces extend in the X-direction and etching the exposed surfaces of the second sacrificial layers 111b reduces a width of the second sacrificial layers 111b on either side of the second sacrificial layers 111b in the Y-direction. In some embodiments, the second sacrificial layers 111b may be etched using a wet etch process (e.g., hydrofluoric etch, buffered hydrofluoric acid, phosphoric acid, etc.). In other embodiments, the exposed surfaces of the second sacrificial layers 111b may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the second sacrificial layers 111b in the Y-direction reduces a width of the second sacrificial layers 111b relative to the second insulating layers 112b disposed in the stack second portion 108b such that second cavities 117b are formed whose boundaries are formed by top and bottom surfaces of adjacent second insulating layers 112b and a surface of the partially etched second sacrificial layers 111b that face the second portion first trenches 132b and extend in the X-direction. In some embodiments, an adhesive layer may be formed on exposed portions of sidewalls of the second cavities 117b, as previously described herein with respect to the first cavities 117a.

Figure 17A:
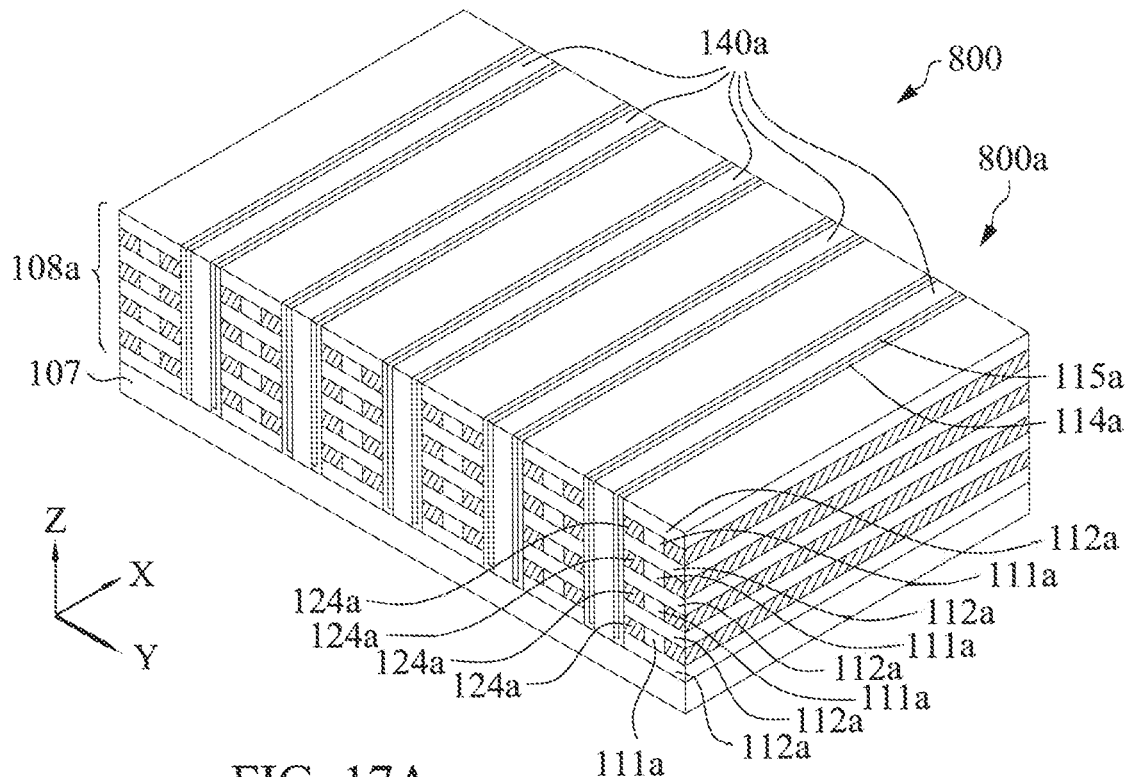
Figure 17B:
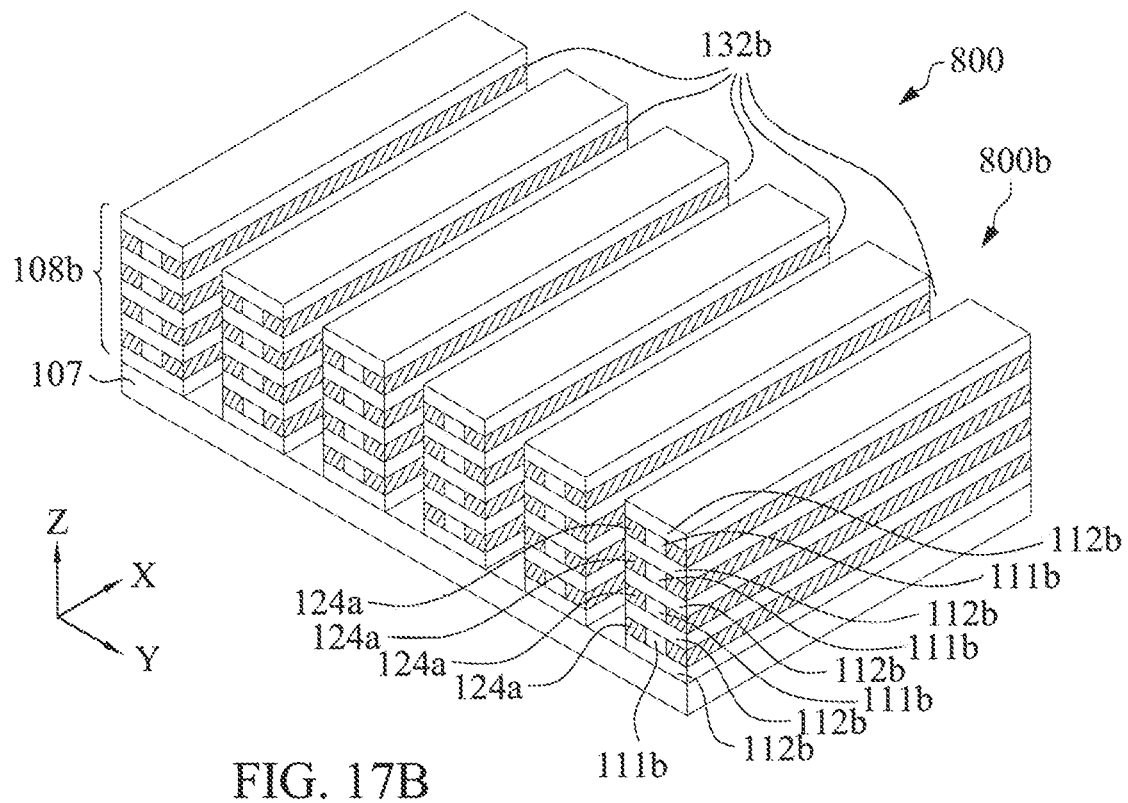

At operation 722, second gate layers are formed in second cavities of the stack second portion, but no processing operation is performed in the stack first portion. Corresponding to operation 722, FIG. 17B is a top, perspective view of the stack second portion 180b after forming second gate layers 124b in the second cavities 117b and FIG. 17A is a top, perspective view of the stack first portion 180a where no processing operation is performed. In various embodiments, the second gate layers 124b are formed by depositing a gate dielectric and/or gate metal in the second cavities 117b (e.g., over the adhesive layer), such that the portion of the second gate layers 124b is continuous along the walls of each of the second portion first trenches 132b. In various embodiments, the second gate layers 124b may be formed from a high-k dielectric material. Although, each of the second gate layers 124b shown in FIG. 17B is shown as a single layer, in other embodiments, the second gate layers 124b can be formed as a multi-layer stack (e.g., including a gate dielectric layer and a gate metal layer), while remaining within the scope of the present disclosure. The second gate layers 124b may be formed of different high-k dielectric materials or a similar high-k dielectric material. Example high-k dielectric materials include a metal oxide or a silicate of Hf, Al, Zr, La, Mg, Ba, Ti, Pb, and combinations thereof (e.g., Al, Ti, TiN, TaN, Co, Ag, Au, Cu, Ni, Cr, Hf, Ru, W, Pt, WN, Ru, etc.). The second gate layers 124b can be deposited using any suitable method, including, for example, MBD, ALD, CVD, PECVD, MOCVD, epitaxial growth, and the like.

In some embodiments, the second gate layers 124b may be formed from a second material having a second workfunction which causes the second semiconductor devices 110b formed in the second portion 800b to have the high second workfunction, as previously described herein. In some embodiments, the second gate layers 124b may include a stack of multiple metal materials. For example, the gate metal may be a p-type workfunction layer, an n-type workfunction layer, multi-layers thereof, or combinations thereof. The workfunction layer may also be referred to as a workfunction metal. Example p-type workfunction metals that may include TiN, TaN, Ru, Mo, Al, WN, $ZrSi_2$, $MoSi_2$, $TaSi_2$, $NiSi_2$, WN, other suitable p-type workfunction materials, or combinations thereof. Example n-type workfunction metals that may include Ti, Ag, TaAl, TaAlC, TiAlN, TaC, TaCN, TaSiN, Mn, Zr, other suitable n-type workfunction materials, or combinations thereof. A workfunction value is associated with the material composition of the workfunction layer, and thus, the material of the workfunction layer is chosen to tune its workfunction value so that a target threshold voltage $V_t$ is achieved in the device that is to be formed, i.e., a high threshold voltage in the second semiconductor devices 110b. The workfunction layer(s) may be deposited by CVD, PVD, ALD, and/or other suitable process.

At operation 724, a second memory layer is formed in each of the plurality of second portion first trenches on exposed radial surfaces of the second insulating layers and the portion of the second gate layers located in the second portion first trenches, such that the second memory layer extends in the first direction (e.g., the X-direction), and from the top surface of the semiconductor die to the substrate. At operation 726, a second channel layer structure is formed within each of the plurality of second portion first trenches on exposed radial surfaces of the second memory layer such that the second channel layer structure also extends in the first direction. At operation 728, the plurality of second portion first trenches are filled with an insulating material to form second isolation layers. However, no processing operation is performed on the stack first portion during operations 724-728.

Figure 18A:
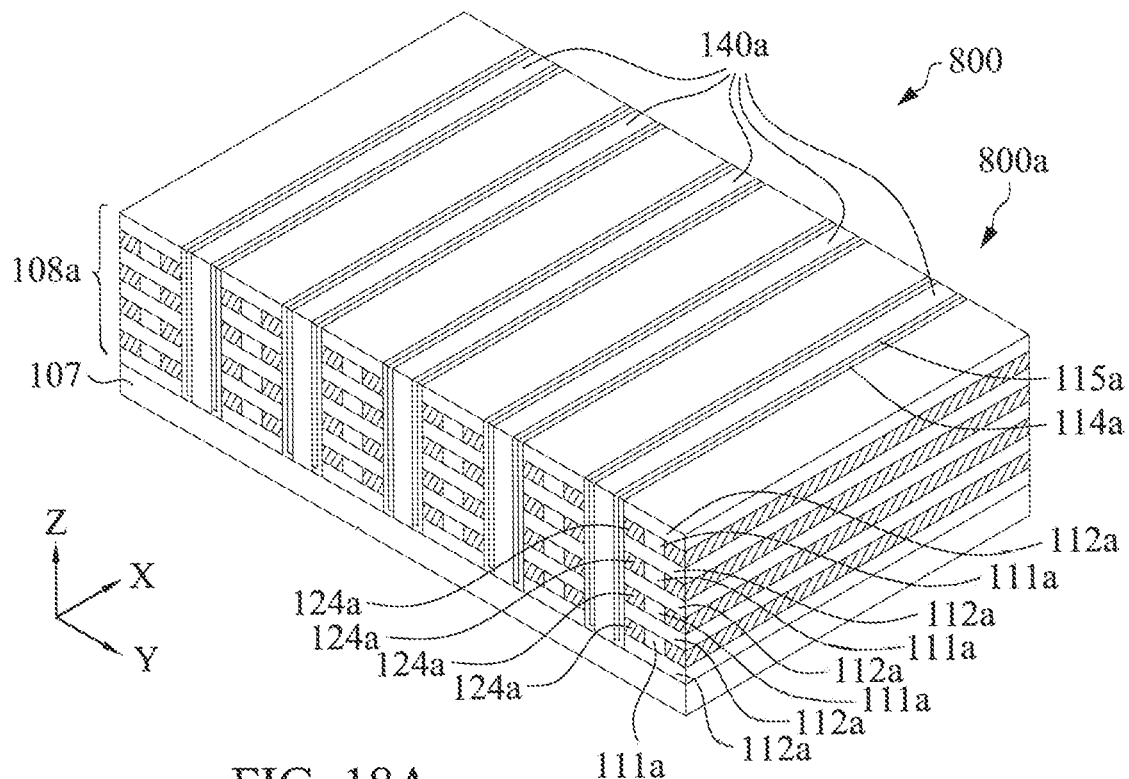
Figure 18B:
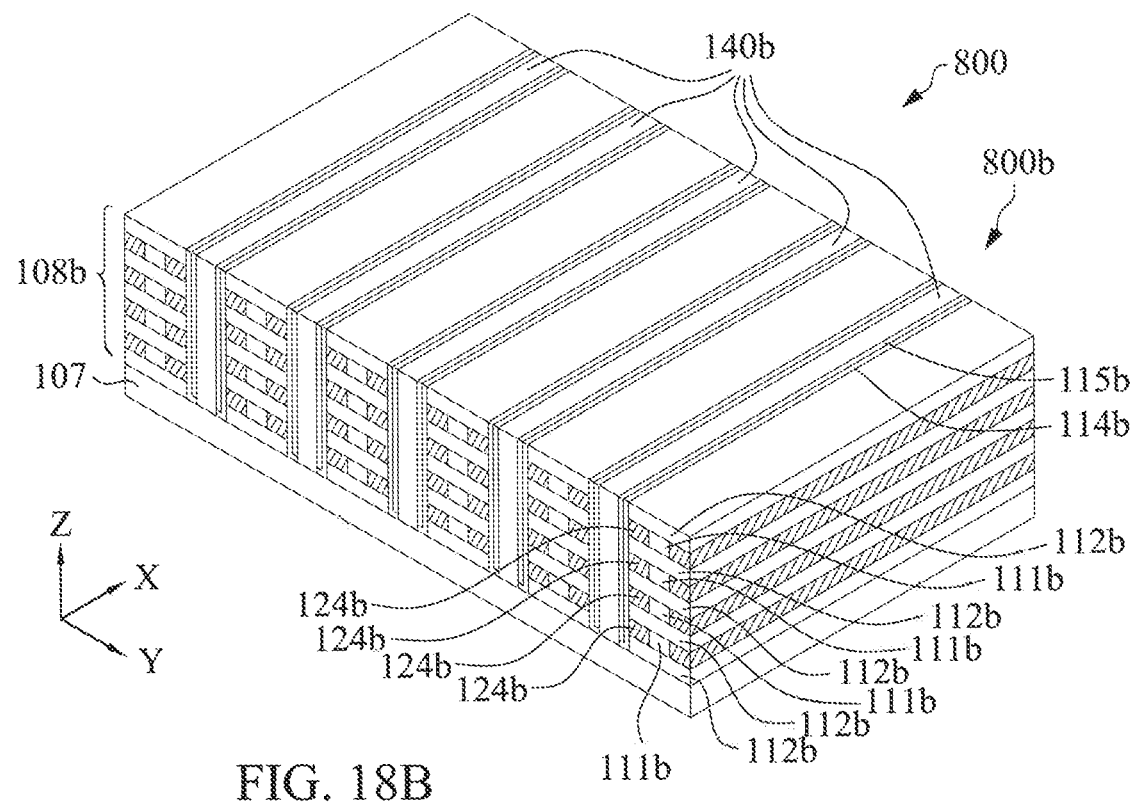

Corresponding to operations 724-728, FIG. 18B is a top, perspective view of the second portion 800b of the semiconductor die 800 after forming second channel layer structure 115b, second memory layer 114b, and second isolation layers 140b, and FIG. 18A is a top, perspective view of the first portion 800a on which no processing operation is performed. The second memory layer 114b may include a ferroelectric material, for example, lead zirconate titanate (PZT), $PbZr/TiO_3$, $BaTiO_3$, $PbTiO_2$, $HfO_2$, $Hr1-xZ_{rx}O_2$, $ZrO_2$, $TiO_2$, NiO, $TaO_x$, $Cu_2O$, $Nb_2O_5$, $AlO_x$, etc. The second memory layer 114b may be formed using PVD, CVD, LPCVD, PECVD, ALD, MBE, any other suitable process or a combination thereof. A conformal coating may be deposited such that the second memory layer 114b is continuous on the walls of the second portion first trenches 132b.

The second channel layer structure 115b is formed on a radially inner surface of the second memory layer 114b in the Y-direction. In some embodiments, the second channel layer structure 115b may be formed from a semiconductor material, for example, Si (e.g., polysilicon or amorphous silicon that may be n-type or p-type), Ge, SiGe, silicon carbide (SiC), IGZO, ITO, IZO, ZnO, IWO, etc. The second channel layer structure 115b may be formed using PVD, CVD, LPCVD, PECVD, ALD, MBE, any other suitable process or a combination thereof. A conformal coating may be deposited such that the second channel layer structure 115b is continuous on the radially inner surface of the second memory layer 114b. In some embodiments, the second channel layer structure 115b may be formed from a second channel material or have a second channel thickness to cause the second semiconductor devices 110b formed in the second portion 800b to have the second workfunction, as previously described herein.

The insulating material may be deposited in the second portion first trenches 132b to form the second isolation layers 140b using any suitable method, for example, MBD, ALD, CVD, PECVD, MOCVD, epitaxial growth, and the like. The second isolation layers 140b may include $SiO_2$, SiON, SiN, SiCN, $HfO_2$, $TaO_x$, $TiO_x$, $AlO_x$, etc. In some embodiments, the second isolation layers 140b may be formed from the same material as the second insulating layers 112b. A CMP operation may be performed after filling the first portion first trenches 132a with the insulating material to form the first isolation layers 140a to planarize the top surface of the semiconductor die 800.

Figure 19A:
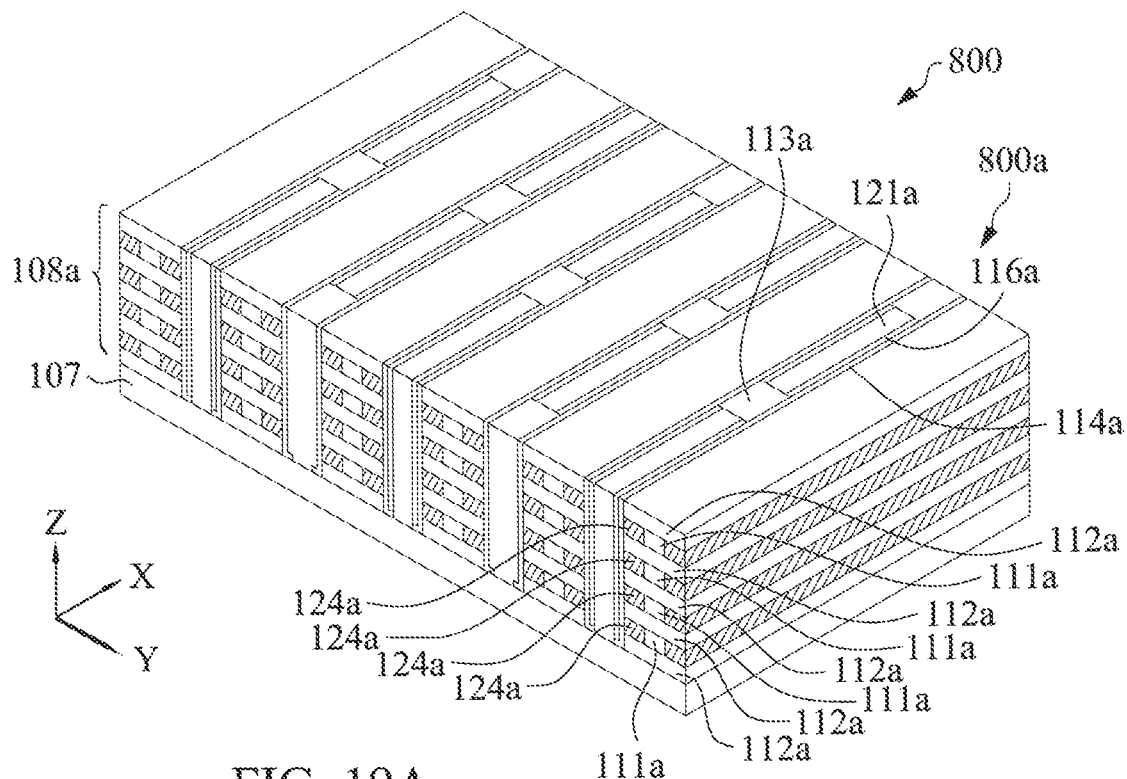
Figure 19B:
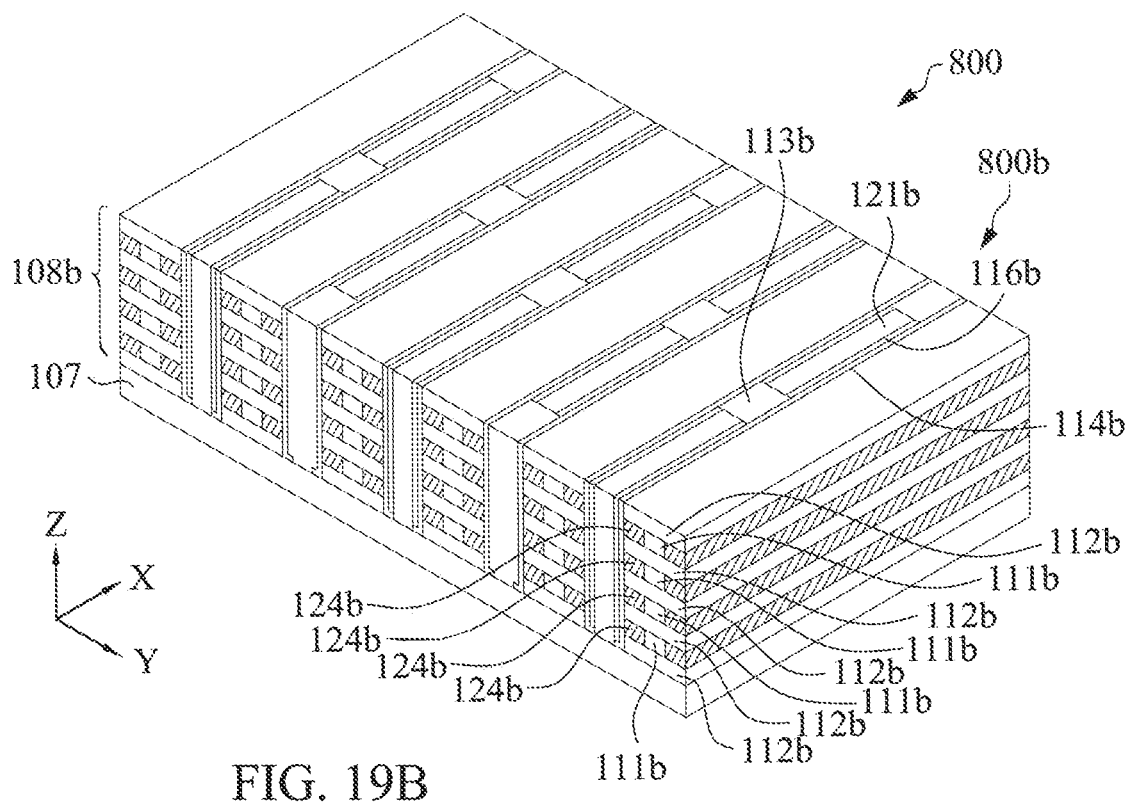

At operation 730, first channel layers and second channel layers are formed. At operation 732, first and second device spacers are formed. Corresponding to operation 732-734, FIG. 19A is a top, perspective view of the first portion 800a and FIG. 19B is a top, perspective view of the second portion 800b, after forming first channel layers 116a and first device spacers 113a in the first portion, and second channel layers 116b and second device spacers 113b in the second device portion 800b. The first and second portions 800a and 800b are now processed simultaneously. The channel layers 116a/b may be formed by etching through portions of the isolation layers 140a/b and adjacent portions of the channel layer structures 115a/b in the Z-direction up to the substrate 107, such that an array of first channel layers 116a are formed in the first portion 800a, and an array of second channel layers 116b are formed in the second portion 800b, which are co-extensive with first inner spacer structures 121a and second inner spacer structures 121b formed from the first isolation layer 140a and the second isolation layer 140b, respectively.

The isolation layers 140a/b and the channel layer structures 115a/b may be etched simultaneously or sequentially, using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the channel layers 116a/b and the inner spacer structures 121a/b. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. The cavities formed due to the etching process are then filled with an insulating material (e.g., using MBD, ALD, CVD, PECVD, MOCVD, epitaxial growth, and the like), for example, the same material used to form the isolation layers 140a/b, to form the device spacers 113a/b with the inner spacer structures 121a/b disposed between adjacent device spacers 113a/b. Thus, a plurality of rows that include the memory layers 114a/b and the channel layers 116a/b are formed in the semiconductor die first portion 800a and second portion 800b, respectively, extending in the X-direction, and having device spacers 113a/b disposed at regular intervals separating adjacent semiconductor devices 110a/b that will be form in subsequent steps in the semiconductor die 800. A CMP operation may be performed after forming the device spacers 113a/b to planarize the top surface of the semiconductor die 800.

Figure 20A:
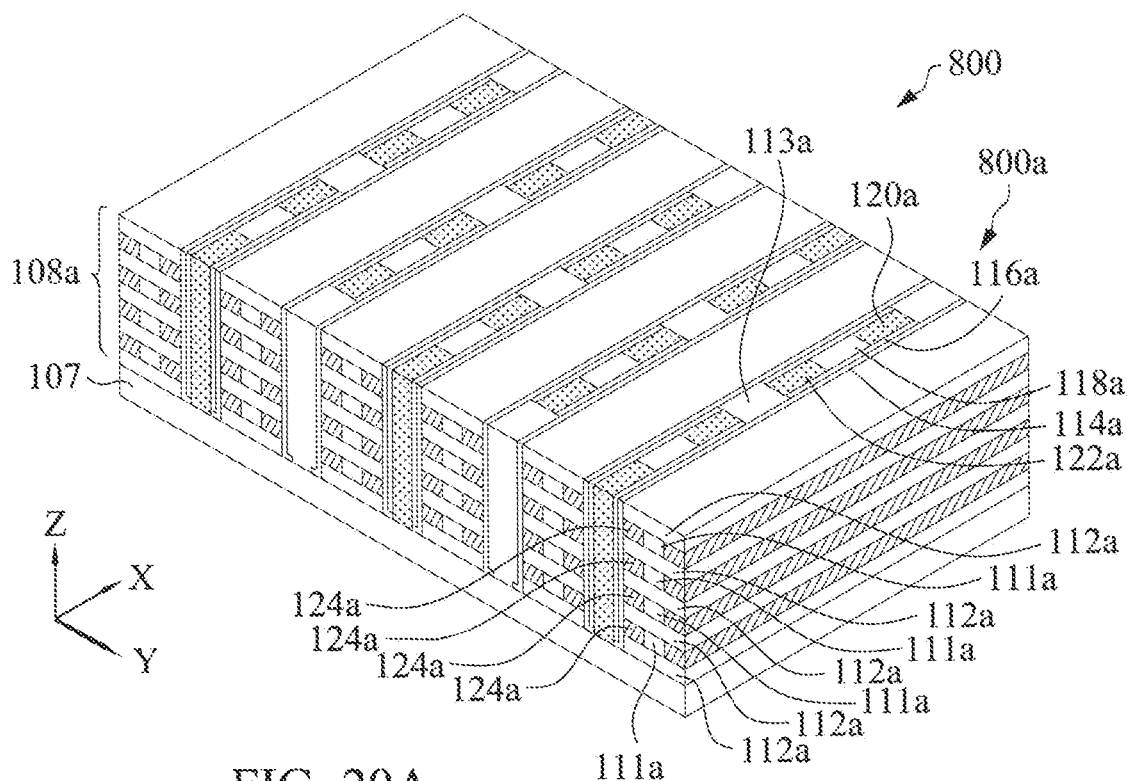
Figure 20B:
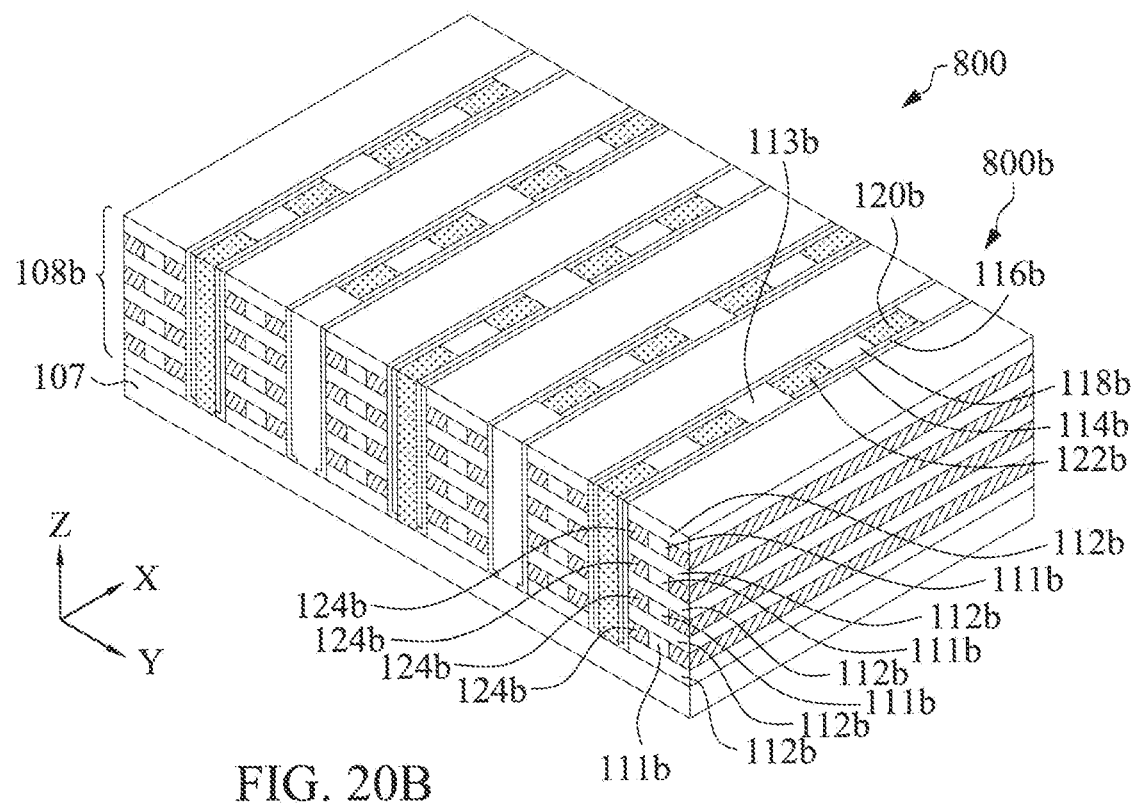

At operation 734, a first source and first drain are formed in the first portion 800a, and second source and second drain are formed in the second portion 800b. Corresponding to operation 734, FIG. 20A is a top, perspective view of the first portion 800a of the semiconductor die 800 after forming first sources 120a and first drains 122a, and FIG. 20B is a top, perspective view of the second portion 800b of the semiconductor die 800 after forming second sources 120b and second drains 122b. To form the sources 120a/b and drains 122a/b, cavities may be formed at axial ends of the inner spacer structures 121a/b in the X-direction to form inner spacers 118a/b by etching through the inner spacer structures 121a/b in the Z-direction. The cavities may be formed using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the third cavities. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Sources 120a/b and drains 122a/b are formed by filling the cavities with the source and the drain material, respectively. The sources 120a/b and the drains 122a/b may be formed by depositing the drain material in the cavities using an epitaxial growth process, PVD, CVD, LPCVD, PECVD, ALD, MBE, any other suitable process or a combination thereof, a HARP, another applicable process, or combinations thereof. In-situ doping (ISD) may be applied to form doped sources 120a/b or drains 122a/b, thereby creating the junctions for each semiconductor devices 110a/b. N-type devices can be formed by implanting arsenic (As) or phosphorous (P), and p-type devices can be formed by implanting boron (B). The sources 120a/b and drains 122a/b are located at opposite axial ends of corresponding inner spacers 118a/b. Portions of radially outer surface of the sources 120a/b and drains 122a/b are in contact with corresponding portions of a radially inner surface of the channel layer 116a/b. A CMP operation may be performed after forming the sources 120a/b drains 122a/b to planarize the top surface of the semiconductor die 800.

Figure 21A:
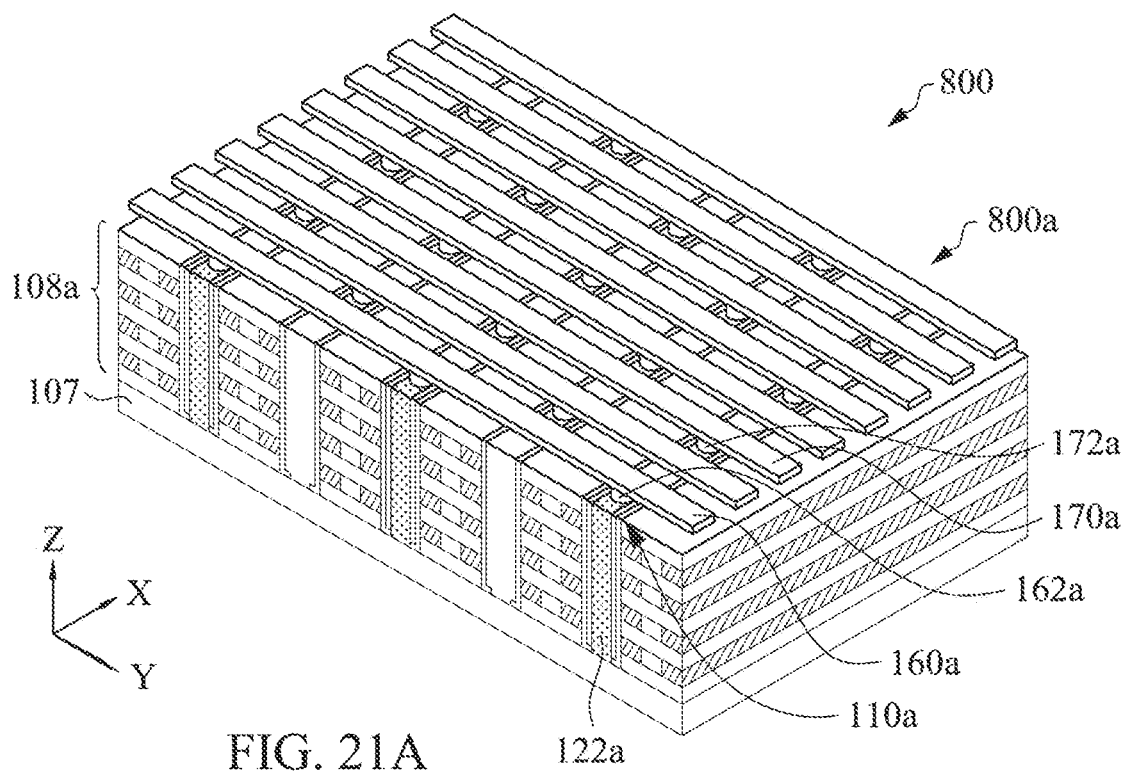
Figure 21B:
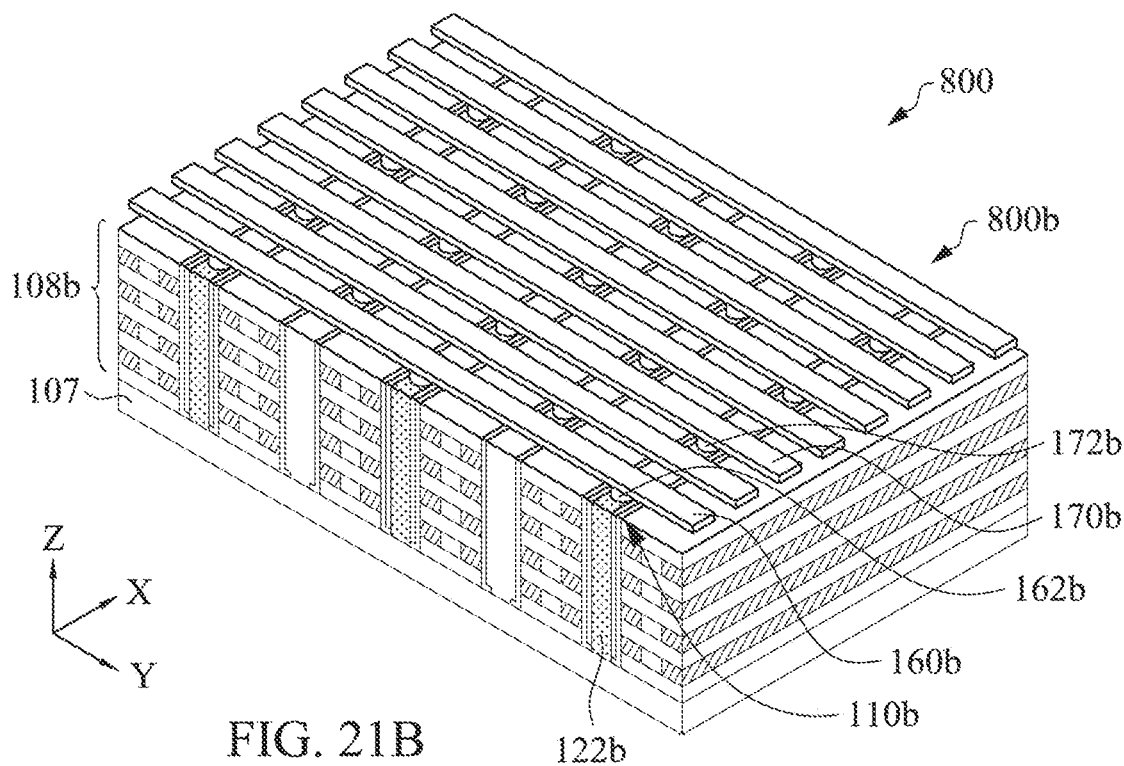

At operation 736, first and second global source lines, and first and second global drain line are formed on a top surface of the stack first portion disposed in the first portion 800a, and on a top surface of the stack second portion disposed in the second portion of the semiconductor die, respectively, and electrically coupled to corresponding sources and drains. Corresponding to operation 736, FIG. 21A is a top, perspective view of the first portion 800a showing the first global source lines 160a and first global drain lines 170a coupled to corresponding first sources 120a and first drains 122a through first source vias 162a and first drain vias 172a, respectively. Similarly, FIG. 21B is a top, perspective view of the second portion 800b showing the second global source lines 160b and second global drain lines 170b coupled to corresponding second sources 120b and second drains 122b via second source vias 162b and second drain vias 172b, respectively.

In some embodiments, to form the global source lines 160a/b and global drain lines 170a/b, source vias 162a/b are formed on a top surface of the corresponding sources 120a/b and drain vias 172a/b are formed on top surfaces of the corresponding drains 122a/b. The source vias 162a/b and the drain vias 172a/b may be formed from a conducting material for example, tungsten (W), copper (Cu), cobalt (Co), etc. In some embodiments, the source vias 162a/b and the drain vias 172a/b may be formed using a dual damascene process. For example, a cavity may be formed in the sources 120a/b and the drains 122a/b. In some embodiments, a spacer layer may deposited on a top surface of the semiconductor die 800 (e.g., a top surface of the topmost insulating layer 112a/b) and throughholes formed in the spacer layer at locations corresponding to the source vias 162a/b and drain vias 172a/b.

In some embodiments, a diffusion barrier (e.g., a Ta based material) may be deposited in each of the fourth cavities, and a thin metal (e.g., Cu) seed layer is deposited on the diffusion barrier (e.g., using PVD, CVD, MBOE, ALD, etc.). This is followed by electroplating of the metal (e.g., Cu) on the metal seed layer until the metal fills the trenches and projects axially upwards of the sources 120a/b and the drains 122a/b. This process can be repeated until the source vias 162a/b and the drain vias 172a/b having a desired height are obtained. The sacrificial layer may be removed before or after forming the source vias 162a/b and the drain vias 172a/b, or be left disposed on the top surface of the semiconductor die 800.

The plurality of global source lines 160a/b are formed that are coupled to a set of the source vias 162a/b and thereby, a set of sources 120a/b. Similarly, a set of global drain lines 170a/b are formed that are coupled to a set of the drain vias 172a/b and thereby, a set of drains 122a/b, and may be formed simultaneously with the global source lines 160a/b. Each of the global source lines 160a/b and the global drain lines 170a/b extend in the Y-direction. The global source lines 160a/b and the global drain lines 170a/b may be formed from a conducting material, for example, tungsten (W), copper (Cu), cobalt (Co), etc. The global source lines 160a/b and the global drain lines 170a/b may also be formed using a dual damascene process, for example, after formation of the source vias 162a/b and drain vias 172a/b before removing the spacer layer. While the semiconductor die 800 is shown without the spacer layer, in some embodiments, the spacer layer may remain included in the final semiconductor die 800. The global source lines 160a/b and the global drain lines 170a/b may be used to communicate an electrical signal (e.g., a current or voltage) to corresponding sources 120a/b, and the global drain lines 170a/b may be used to receive an electrical signal (e.g., a current or voltage) from a corresponding drain 122a/b, when the gate layer 124a/b is activated.

In some embodiments, a semiconductor die comprises a first set of semiconductor devices disposed at a first location of the semiconductor die, each of the first set of semiconductor devices having a first workfunction to cause each of the first set of semiconductor devices to store memory for a first time. The semiconductor die also includes a second set of semiconductor devices disposed at a second location of the semiconductor die different from the first location, each of second set of semiconductor devices having a second workfunction that is greater than the first workfunction to cause each of the second set of semiconductor devices to store memory for a second time period greater than the first time period.

In some embodiments, a semiconductor die comprises a first set of semiconductor devices disposed at a first location of the semiconductor die, and a second set of semiconductor devices disposed at a second location of the semiconductor die different from the first location. Each of the first and second set of semiconductor devices comprises a source, a drain spaced apart from the source in a first direction, and a channel layer disposed radially outwards of at least one radially outer surface of the source and the drain in a second direction perpendicular to the first direction and extending in the first direction. A memory layer is disposed on a radially outer surface of the channel layer in the second direction and extends in the first direction. At least one first gate layer is disposed on a radially outer surface of the memory layer. The at least one gate layer included in each of the first set of semiconductor devices has a first property and the at least one gate layer included in each of the second set of semiconductor devices has a second property different from the first property, the first property configured to cause each of the first set of semiconductor devices to have a first workfunction, and the second property configured to cause each of the second set of semiconductor devices to have a second workfunction greater than the first workfunction.

In some embodiments, a method of making a semiconductor die comprises providing a substrate, and forming a stack comprising a plurality of insulating layers and a plurality of sacrificial layers alternatively stacked on top of each other. The method comprises replacing at least a portion of first sacrificial layers of the plurality of sacrificial layers located in a stack first portion of the stack to form first gate layers. The method comprises forming first channel layers extending in a first direction in the stack first portion. The method comprises forming first memory layers extending in the first direction in the stack first portion. The method comprises subsequently, replacing at least a portion of second sacrificial layers of the plurality of sacrificial layers located in a stack second portion of the stack to form second gate layers. The method comprises forming second channel layers extending in the first direction in the stack second portion, and forming second memory layers extending in the first direction in the stack second portion. The method comprises forming: first sources and first drains spaced apart from a corresponding first source in the first direction such that a corresponding first channel layer is disposed on radially outer surface of the first sources and the first drains in the first direction to form a first set of semiconductor devices, and second sources and second drains spaced apart from a corresponding second source in the first direction such that a corresponding second channel layer is disposed on radially outer surface of the second sources and the second drains in the first direction to form a second set of semiconductor devices. Each of the first set of semiconductor devices has a first workfunction different from a second workfunction of each of the second set of semiconductor devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
a first set of semiconductor devices disposed at a first location of the semiconductor die, each of the first set of semiconductor devices having a first workfunction to cause each of the first set of semiconductor devices to store memory for a first time period; and
a second set of semiconductor devices disposed at a second location of the semiconductor die different from the first location, each of second set of semiconductor devices having a second workfunction that is greater than the first workfunction to cause each of the second set of semiconductor devices to store memory for a second time period greater than the first time period, wherein each of the first and the second set of semiconductor devices comprises:
a source;
a drain spaced apart from the source in a first direction by an inner spacer; and
a channel layer disposed radially outwards of radially outer surfaces of the inner spacer, the source and the drain in a second direction perpendicular to the first direction and extending in the first direction.

2. The semiconductor die of claim 1, wherein, each of the first and second set of semiconductor devices further comprises:
a memory layer disposed on a radially outer surface of the channel layer in the second direction and extending in the first direction; and
at least one gate layer disposed on a radially outer surface of the memory layer in the second direction and extending in the first direction.

3. The semiconductor die of claim 2, wherein:
the at least one gate layer included in each of the first set of semiconductor devices comprises a first material to cause the each of the first set of semiconductor devices to have the first workfunction; and
the at least one gate layer included in each of the second set of semiconductor devices comprises a second material different from the first material to cause each of the second set of semiconductor devices to have the second workfunction.

4. The semiconductor die of claim 2, wherein:
each of the at least one gate layer included in the first set of semiconductor devices comprises a n-type material; and
the second set of semiconductor devices further comprises a barrier layer interposed between the memory layer and the at least one gate layer included in each of the second set of semiconductor devices.

5. The semiconductor die of claim 4, wherein a first thickness of the at least one gate layer included in each of the first set of semiconductor devices is approximately equal to a sum of a second thickness of the at least one gate layer included in each of the second set of semiconductor devices and a thickness of the barrier layer included in each of the second set of semiconductor devices.

6. The semiconductor die of claim 2, wherein:
each of the at least one gate layer included in the first set and the second set of semiconductor devices comprises a n-type material;
each of the first set of semiconductor devices comprises a first barrier layer interposed between the memory layer and the at least one gate layer included in each of the first set of semiconductor devices, the first barrier layer having a first barrier thickness; and
each of the second set of semiconductor devices comprises a second barrier layer interposed between the memory layer and the at least one gate layer included in each of the second set of semiconductor devices, the second barrier layer having a second barrier thickness greater than the first barrier thickness.

7. The semiconductor die of claim 2, wherein:
each of the at least one gate layer included in the first set and the second set of semiconductor devices comprises a p-type material;
each of the first set of semiconductor devices comprise a first barrier layer interposed between the memory layer and the at least one gate layer included in each of the first set of semiconductor devices, the first barrier layer having a first barrier thickness; and
each of the second set of semiconductor devices comprise a second barrier layer interposed between the memory layer and the at least one gate layer included in each of the second set of semiconductor devices, the second barrier layer having a second barrier thickness that is less than the first barrier thickness.

8. The semiconductor die of claim 7, wherein:
a first sum of a thickness of the at least one gate layer included in each of the first set of semiconductor devices and the first barrier thickness is approximately equal to a second sum of a thickness of the at least one gate layer included in each of the second set of semiconductor devices and the second barrier thickness.

9. The semiconductor die of claim 2, wherein:
a first channel thickness of the channel layer included in each of the first set of semiconductor devices is different from a second channel thickness of the channel layer included in each of the second set of semiconductor devices.

10. The semiconductor die of claim 2, wherein:
a first channel material of the channel layer included in each of the first set of semiconductor devices is different from a second channel material of the channel layer included in each of the second set of semiconductor devices.

11. The semiconductor die of claim 10, wherein the at least one gate layer included in each of the first set of semiconductor devices comprises a first material that is different from a second material of the at least one gate layer included in each of the second set of semiconductor devices.

12. The semiconductor die of claim 1, wherein:
the first location is a first side of the semiconductor die in a first direction, a first array of the first set of semiconductor devices is disposed on the first side;
the second location is a second side of the semiconductor die in the first direction opposite the first side, a second array of the second set of semiconductor devices being disposed on the second side; and
an array isolation layer is interposed between the first array and the second array.

13. The semiconductor die of claim 1, wherein:
the first set of semiconductor devices is disposed adjacent to the second set of semiconductor devices in at least a first direction, a second direction perpendicular to the first direction, or the first direction and the second direction; and an array isolation layer is interposed between the first set and the second set of semiconductor devices.

14. A semiconductor die, comprising:

a first set of semiconductor devices disposed at a first location of the semiconductor die, and a second set of semiconductor devices disposed at a second location of the semiconductor die different from the first location, each of the first and second set of semiconductor devices comprising:

a source, a drain spaced apart from the source in a first direction by an inner spacer;

a channel layer disposed radially outwards of radially outer surfaces of the inner spacer, the source and the drain in a second direction perpendicular to the first direction and extending in the first direction;

a memory layer disposed on a radially outer surface of the channel layer in the second direction and extending in the first direction; and at least one first gate layer disposed on a radially outer surface of the memory layer, wherein the at least one gate layer included in each of the first set of semiconductor devices has a first property and the at least one gate layer included in each of the second set of semiconductor devices has a second property different from the first property, the first property configured to cause each of the first set of semiconductor devices to have a first workfunction, and the second property configured to cause each of the second set of semiconductor devices to have a second workfunction greater than the first workfunction.

15. The semiconductor die of claim 14, wherein:

the at least one gate layer included in each of the first set of semiconductor devices comprises a first material; and the at least one gate layer included in each of the second set of semiconductor devices comprises a second material different from the first material.

16. The semiconductor die of claim 14, wherein:

each of the at least one gate layer included in the first set of semiconductor devices comprises a n-type material;

the second set of semiconductor devices further comprises a barrier layer interposed between the memory layer and the at least one gate layer included in each of the second set of semiconductor devices; and a first thickness of the at least one gate layer included in each of the first set of semiconductor devices is approximately equal to a sum of a second thickness of the at least one gate layer included in each of the second set of semiconductor devices and a thickness of the barrier layer included in each of the second set of semiconductor devices.

17. The semiconductor die of claim 14, wherein:

each of the at least one gate layers included in the first set and the second set of semiconductor devices comprises a n-type material;

each of the first set of semiconductor devices comprises a first barrier layer interposed between the memory layer and the at least one gate layer included in each of the first set of semiconductor devices, the first barrier layer having a first barrier thickness; and each of the second set of semiconductor devices comprises a second barrier layer interposed between the memory layer and the at least one gate layer included in each of the second set of semiconductor devices, the second barrier layer having a second barrier thickness greater than the first barrier thickness.

18. The semiconductor die of claim 14, wherein:

each of the at least one gate layer included in the first set and the second set of semiconductor devices comprises a p-type material;

each of the first set of semiconductor devices comprises a first barrier layer interposed between the memory layer and the at least one gate layer included in each of the first set of semiconductor devices, the first barrier layer having a first barrier thickness;

each of the second set of semiconductor devices comprise a second barrier layer interposed between the memory layer and the at least one gate layer included in each of the second set of semiconductor devices, the second barrier layer having a second barrier thickness that is less than the first barrier thickness; and a first sum of a thickness the at least one gate layer included in each of the first set of semiconductor devices and the first barrier thickness is approximately equal to a second sum of a thickness of the at least one gate layer included in each of the second set of semiconductor devices and the second barrier thickness.

19. A semiconductor die, comprising:

a first set of semiconductor devices disposed at a first location of the semiconductor die; and a second set of semiconductor devices disposed at a second location of the semiconductor die different from the first location;

wherein each of the first and the second set of semiconductor devices comprises:

a source;

a drain spaced apart from the source in a first direction by an inner spacer;

a channel layer disposed radially outwards of radially outer surfaces of the inner spacer, the source and the drain in a second direction perpendicular to the first direction and extending in the first direction; and a memory layer disposed on a radially outer surface of the channel layer in the second direction and extending in the first direction.

20. The semiconductor die of claim 19, wherein each of the first set of semiconductor devices has a first workfunction to cause each of the first set of semiconductor devices to store memory for a first time period, and wherein each of the second set of semiconductor devices has a second workfunction greater than the first workfunction to cause each of the second set of semiconductor devices to store memory for a second time period greater than the first time period.

* * * * *